(12) United States Patent
Kawai et al.

(10) Patent No.: US 9,167,153 B2
(45) Date of Patent: Oct. 20, 2015

(54) IMAGING DEVICE DISPLAYING SPLIT IMAGE GENERATED FROM INTERPOLATION PIXEL DATA BASED ON PHASE DIFFERENCE PIXEL

(71) Applicant: FUJIFILM Corporation, Tokyo (JP)

(72) Inventors: Tomoyuki Kawai, Saitama (JP); Katsutoshi Izawa, Saitama (JP); Junji Hayashi, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/541,758

(22) Filed: Nov. 14, 2014

(65) Prior Publication Data

US 2015/0070551 A1    Mar. 12, 2015

Related U.S. Application Data

(63) Continuation of application No. PCT/JP2013/063631, filed on May 16, 2013.

(30) Foreign Application Priority Data

Jun. 1, 2012 (JP) .................................. 2012-126164

(51) Int. Cl.
*H04N 5/232* (2006.01)
*H04N 5/378* (2011.01)
(Continued)

(52) U.S. Cl.
CPC .............. *H04N 5/23212* (2013.01); *G02B 7/34* (2013.01); *G03B 17/18* (2013.01); *H04N 5/3696* (2013.01); *H04N 5/378* (2013.01)

(58) Field of Classification Search
CPC . H04N 5/23212; H04N 5/378; H04N 5/3696; G02B 7/34; G03B 17/18
See application file for complete search history.

(56) References Cited

U.S. PATENT DOCUMENTS

2006/0251413 A1    11/2006 Toji
2009/0153693 A1*    6/2009 Onuki et al. ............... 348/222.1
(Continued)

FOREIGN PATENT DOCUMENTS

JP    2001-309210 A    11/2001
JP    2004-40740 A    2/2004
(Continued)

OTHER PUBLICATIONS

International Search Report, mailed Jun. 11, 2013, issued in PCT/JP2013/063631.
(Continued)

*Primary Examiner* — Sinh Tran
*Assistant Examiner* — Shahbaz Nazrul
(74) *Attorney, Agent, or Firm* — Birch, Stewart, Kolasch & Birch, LLP

(57) ABSTRACT

An imaging device comprising an imaging optical system, a lens movement mechanism, an imaging element, a first interpolation device, a second interpolation devices, a photographic image generation device, a split image generation device using a first image formed by the outputs of the first phase difference pixels and the first interpolation pixels and a second image formed by the outputs of the second phase difference pixels and the second interpolation pixels to generate a split image, and a display device displaying the photographic image generated by the photographic image generation device, the display device displaying the split image generated by the split image generation device in a display area of the photographic image.

12 Claims, 28 Drawing Sheets

(51) Int. Cl.
*H04N 5/369* (2011.01)
*G02B 7/34* (2006.01)
*G03B 17/18* (2006.01)

(56) References Cited

U.S. PATENT DOCUMENTS

| | | |
|---|---|---|
| 2009/0153720 A1 | 6/2009 | Suzuki et al. |
| 2010/0238343 A1* | 9/2010 | Kawarada ............... 348/345 |
| 2012/0057057 A1* | 3/2012 | Amano .................. 348/294 |
| 2012/0113314 A1 | 5/2012 | Onuki et al. |
| 2012/0154637 A1* | 6/2012 | Hara ...................... 348/239 |
| 2015/0062374 A1* | 3/2015 | Okazawa ............. 348/229.1 |
| 2015/0103210 A1* | 4/2015 | Inoue ..................... 348/239 |
| 2015/0109518 A1* | 4/2015 | Ishii ...................... 348/353 |
| 2015/0117832 A1* | 4/2015 | Aoki et al. .............. 386/224 |
| 2015/0124129 A1* | 5/2015 | Aoki et al. ............ H04N 9/77 |

FOREIGN PATENT DOCUMENTS

| | | |
|---|---|---|
| JP | 2009-147665 A | 7/2009 |
| JP | 2009-163220 A | 7/2009 |
| JP | 2009-276426 A | 11/2009 |

OTHER PUBLICATIONS

Written Opinion of the International Searching Authority, mailed Jun. 11, 2013, issued in PCT/JP2013/063631.

* cited by examiner

FIG.24
(I)
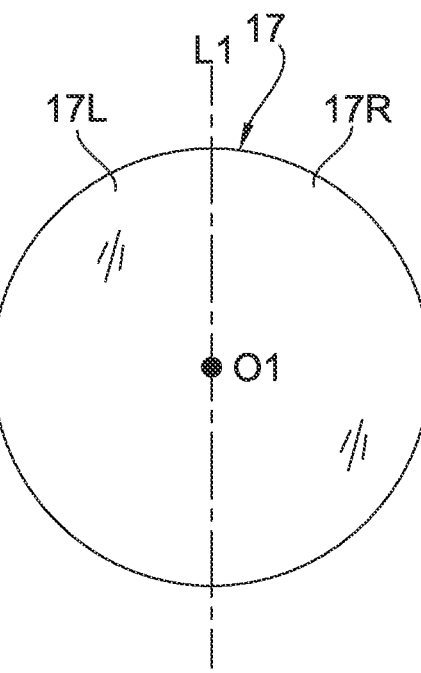
(II)
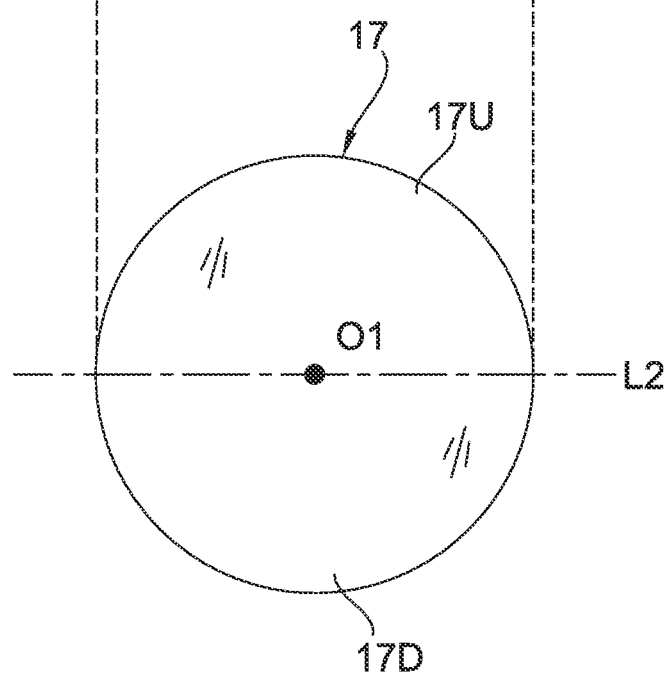

IMAGING DEVICE DISPLAYING SPLIT IMAGE GENERATED FROM INTERPOLATION PIXEL DATA BASED ON PHASE DIFFERENCE PIXEL

CROSS-REFERENCE TO RELATED APPLICATIONS

This application is a Continuation of PCT International Application No. PCT/JP2013/063631 filed on May 16, 2013, which claims priority under 35 U.S.C§119(a) to Japanese Patent Application No. 2012-126164 filed on Jun. 1, 2012. Each of the above application(s) is hereby expressly incorporated by reference, in its entirety, into the present application.

BACKGROUND OF THE INVENTION

1. Field of the Invention

The present invention relates to an imaging device that displays a split image for manual focus.

2. Description of the Related Art

A digital camera is well known that includes a so-called manual focus mode allowing the user to manually perform focus adjustment, in addition to auto focus using a phase difference detection system or a contrast detection system.

A digital camera is well known that includes the manual focus mode, the digital camera adopting a method of using a split microprism screen for displaying a phase difference by visual observation by providing a reflex mirror to allow focus adjustment while checking an imaged object or adopting a method of checking the contrast by visual observation.

By the way, a digital camera without a reflex mirror that is widely used in recent years does not include a method of checking an object image while displaying the phase difference because there is no reflex mirror, and the user needs to depend on the contrast detection system. However, the contrast greater than the resolution of a display device, such as an LCD, cannot be displayed in this case, and a method of displaying the contrast by partial enlargement or the like needs to be adopted.

Consequently, a split image is displayed in a live-view image (also called through image) in recent years to facilitate operation of focusing the object by the operator in the manual focus mode. The split image is obtained by dividing and displaying an object image formed by taking images of pupil-divided object light, and the split image indicates the phase difference of each object image. If the vertically divided split image is out of focus, the vertical images of the split image are horizontally deviated, and the horizontal deviation of the vertical images is eliminated in a focused state. The operator operates a manual focus ring to adjust the focus in order to eliminate the deviation of the vertical images of the split image.

A digital camera described in PTL 1 (Japanese Patent Application Laid-Open No. 2004-40740) moves an aperture in a vertical direction of an optical axis to take object images at two distance measurement positions and uses these two object images to display a split image in a live-view image.

A digital camera described in PTL 2 (Japanese Patent Application Laid-Open No. 2001-309210) obtains a value equivalent to a distance between an image surface of an object image and a light receiving surface of an imaging element as a deviation amount and shifts a split image in a horizontally opposite direction according to the deviation amount to display the split image in a live-view image.

Digital cameras described in PTL 3 (Japanese Patent Application Laid-Open No. 2009-147665) and PTL 4 (Japanese Patent Application Laid-Open No. 2009-163220) include an imaging element provided with, on an imaging surface, a plurality of normal pixels for imaging and two types of phase difference pixels for focus detection for receiving pupil-divided object light. The digital camera generates a photographic image based on output signals from normal pixels to perform live-view image display and generates a split image based on outputs from the two types of phase difference pixels to display the split image in a live-view image.

SUMMARY OF THE INVENTION

However, the digital camera described in PTL 1 requires a mechanical configuration for moving the aperture, and there are problems such as reservation of a space for housing the configuration and increase in the number of components. Further, the digital camera described in PTL 2 does not have a configuration for pupil-dividing and imaging the object light, and it is difficult to realize an accurate split image without a failure.

Although the digital cameras described in PTL 3 and 4 use two types of phase difference pixels to generate the split image, one of the two types of phase difference pixels and the other are arranged in different vertical columns on the imaging surface (see FIG. 2 of PTL 3 and FIG. 2 of PTL 4). In this way, when the positions of the two types of phase difference pixels are deviated in the horizontal direction, phase difference display by the split image cannot be accurately performed due to the influence of the deviation, and the focus may be slightly deviated even in a state that the horizontal deviation of the vertical images is eliminated.

An object of the present invention is to provide an imaging device that can accurately perform phase difference display by a split image.

An imaging device for attaining the object of the present invention includes: an imaging optical system including a focus lens; a lens movement mechanism that receives a focus operation to move the focus lens in an optical axis direction of the imaging optical system; an imaging element including an imaging surface provided with a matrix pixel array including a plurality of first pixel lines formed by a plurality of pixels including photoelectric conversion elements arranged in a first direction and a plurality of second pixel lines formed by the plurality of pixels arranged in a second direction perpendicular to the first direction, the plurality of pixels including first phase difference pixels and second phase difference pixels for selectively receiving object lights passed through different areas of the imaging optical system by pupil division and including normal pixels for receiving the object lights, the first direction parallel to a phase difference direction corresponding to a deviation direction of images of the object lights formed on the imaging surface by the imaging optical system, the second pixel lines provided with the plurality of first and second phase difference pixels; a first interpolation device obtaining outputs of first interpolation pixels positioned between the first phase difference pixels in the second pixel lines by an interpolation process based on outputs of the first phase difference pixels; a second interpolation device obtaining outputs of second interpolation pixels positioned between the second phase difference pixels in the second pixel lines by an interpolation process based on outputs of the second phase difference pixels; a photographic image generation device generating a photographic image from outputs of the normal pixels; a split image generation device using a first image formed by the outputs of the first phase difference pixels and the first interpolation pixels and a second image formed by the outputs of the second phase difference pixels and the second interpolation pixels to generate a split image; and a display device displaying the photographic image generated by the photographic image generation device, the display device displaying the split image generated by the split image generation device in a display area of the photographic image.

According to the imaging device of the present invention, the outputs of the plurality of first phase difference pixels and second phase difference pixels provided in a plurality of the same vertical columns can be used to generate the split image.

It is preferable that the first interpolation device obtains the outputs of the first interpolation pixels by setting the first interpolation pixels between the first phase difference pixels so that the first phase difference pixels and the first interpolation pixels are arranged at equal intervals in the second direction, and the second interpolation device obtains the outputs of the second interpolation pixels by setting the second interpolation pixels between the second phase difference pixels so that the second phase difference pixels and the second interpolation pixels are arranged at equal intervals in the second direction. In this way, since the split image can be easily generated, the image quality of the split image is improved, and the focus adjustment can be easily performed.

It is preferable that the first interpolation device obtains the outputs of the first interpolation pixels by interpolation in a linear interpolation method based on the outputs and position coordinates of two of the first phase difference pixels in the second pixel lines and position coordinates of the first interpolation pixels, and the second interpolation device obtains the outputs of the second interpolation pixels by interpolation in the linear interpolation method based on the outputs and position coordinates of two of the second phase difference pixels in the second pixel lines and position coordinates of the second interpolation pixels. In this way, since the output of each interpolation pixel is optimized, the image quality of the split image is improved, and the focus adjustment can be easily performed.

It is preferable that the imaging element includes color filters of a plurality of colors arranged in a predetermined color filter array on the plurality of pixels, the color filters of the plurality of colors including first filters corresponding to a first color that most contributes to obtaining luminance signals and second filters corresponding to second color of two or more colors other than the first color, the first filters are provided on the first and second phase difference pixels, and the split image generation device uses the first image in black and white generated based on luminance components of the outputs of the first phase difference pixels and the first interpolation pixels and uses the second image in black and white generated based on luminance components of the outputs of the second phase difference pixels and the second interpolation pixels to generate the split image. Since the split image can be generated by the phase difference pixels of one color, the normal pixels used to generate the photographic image can be increased.

It is preferable that the first and second filters are arranged on the normal pixels, and the photographic image generation device generates the photographic image in full color based on the outputs of the normal pixels. Since the black and white split image is displayed in the full-color photographic image, the user can easily recognize the split image.

It is preferable to further include: a comparison device comparing the outputs of the normal pixels and the outputs of the first and second phase difference pixels; and a gain adjustment device applying gains to the outputs of the first and second phase difference pixels based on comparison results of the comparison device to equalize the outputs of the first and second phase difference pixels and the outputs of the normal pixels. Since the luminance difference between the split image and the photographic image is eliminated, a high-quality image without discomfort is obtained.

It is preferable that the first and second phase difference pixels are alternately provided at intervals in the plurality of second pixel lines.

It is preferable that the first and second phase difference pixels are alternately provided at intervals in the plurality of first pixel lines.

It is preferable that the split image is an image formed by arranging the first image and the second image in the vertical direction.

It is preferable that the different areas of the imaging optical system are a first area and a second area symmetric with respect to a first straight line parallel to the vertical direction, the first phase difference pixels selectively receive object light passed through one of the first area and the second area, and the second phase difference pixels selectively receive object light transmitted through the other of the first area and the second area. The first and second images deviated in the horizontal direction, that is, left-right direction, are generated during out-of-focus.

It is preferable to further include: a plurality of third phase difference pixels provided in the plurality of first pixel lines, the third phase difference pixels selectively receiving object light transmitted through one of a third area and a fourth area symmetric with respect to a second straight line parallel to the first direction of the imaging optical system; a plurality of fourth phase difference pixels provided in the plurality of first pixel lines, the fourth phase difference pixels selectively receiving object light transmitted through the other of the third area and the fourth area; and a rotation detection device detecting rotation of the imaging element around the optical axis of the imaging optical system, wherein when the first pixel lines are parallel to the second direction based on a detection result of the rotation detection device, the first interpolation device obtains outputs of third interpolation pixels positioned between the third phase difference pixels in the first pixel lines by an interpolation process based on outputs of the third phase difference pixels, when the first pixel lines are parallel to the second direction based on the detection result of the rotation detection device, the second interpolation device obtains outputs of fourth interpolation pixels positioned between the fourth phase difference pixels in the first pixel lines by an interpolation process based on outputs of the fourth phase difference pixels, and when the first pixel lines are parallel to the second direction based on the detection result of the rotation detection device, the split image generation device uses a third image formed by the outputs of the third phase difference pixels and the third interpolation pixels and uses a fourth image formed by the outputs of the fourth phase difference pixels and the fourth interpolation pixels to generate the split image. In this way, even when vertical imaging is performed by the imaging device, a split image similar to the split image during normal imaging can be obtained.

It is preferable that the first color is green (G), and the second color is red (R) and blue (B).

The imaging device of the present invention includes the plurality of first and second phase difference pixels provided in the plurality of second pixel lines of the imaging element and obtains the outputs of the first interpolation pixels positioned between the first phase difference pixels in each second pixel line and outputs of the second interpolation pixels positioned between the second phase difference pixels by the interpolation process to generate the split image based on the output of each phase difference pixel and each interpolation pixel in each second pixel line. Therefore, the phase difference display by the split image can be more accurately performed than in the conventional techniques. As a result, the manual focus adjustment can be more highly accurately performed than in the conventional techniques. Further, the numbers of first and second phase difference pixels provided in the imaging element can be reduced by obtaining the outputs of the first and second interpolation pixels by the interpolation process. In this way, the normal pixels used to generate the photographic image can be increased.

DETAILED DESCRIPTION OF THE PREFERRED EMBODIMENTS

FIG. 24 is an explanatory view for explaining a left area, a right area, an upper area, and a lower area of an imaging optical system.

DETAILED DESCRIPTION OF THE PREFERRED EMBODIMENTS

Overall Configuration of Digital Camera of First Embodiment

Figure 1:
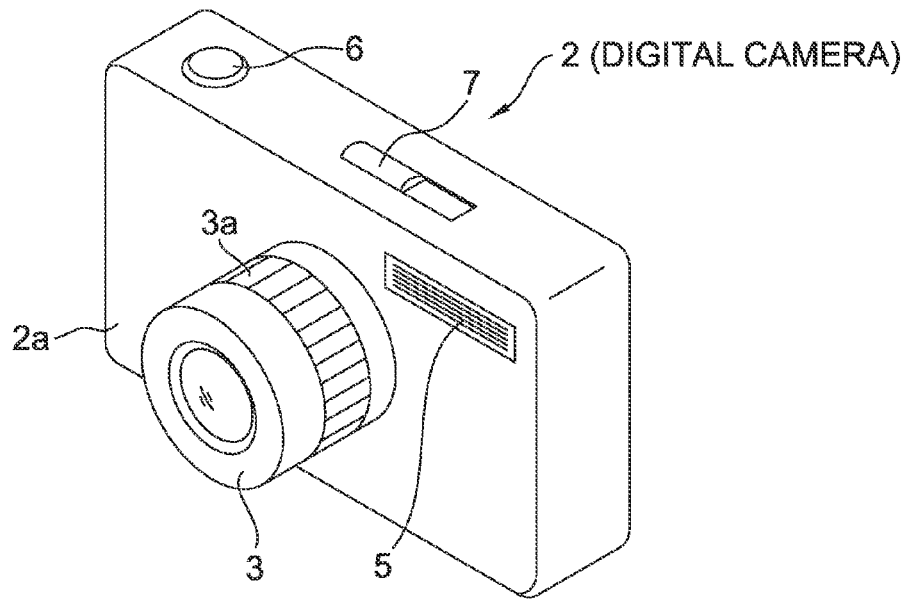
FIG. 1 is a front perspective view of a digital camera of a first embodiment.

As shown in FIG. 1, a front surface of a camera body 2a of a digital camera 2 equivalent to an imaging device of the present invention includes: a lens barrel 3 including an imaging optical system and the like; a stroboscopic light emitting unit 5; and the like. An upper surface of the camera body 2a includes a shutter button 6, a power switch 7, and the like. A focus ring (lens movement mechanism) 3a used for manual focus (hereinafter, simply called MF) operation that can be freely rotated is attached to a peripheral surface of the lens barrel 3.

Figure 2:
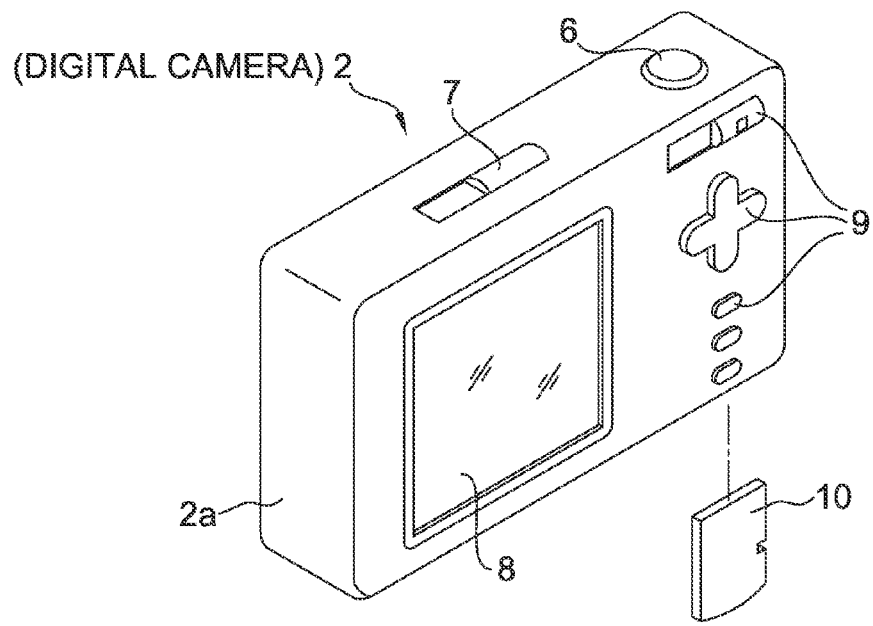
FIG. 2 is a back perspective view of the digital camera.

As shown in FIG. 2, a back surface of the camera body 2a includes a display unit 8 and an operation unit 9. The display unit 8 functions as an electronic viewfinder in an imaging waiting state and displays a live-view image (also called through image). Further, during image reproduction, an image is reproduced and displayed on the display unit 8 based on image data recorded in a memory card 10.

The operation unit 9 includes a mode changing switch, a cross key, an execution key, and the like. The mode changing switch is operated to switch an operation mode of the digital camera 2. The digital camera 2 includes an imaging mode for imaging an object to obtain a photographic image, a reproduction mode for reproducing and displaying the photographic image, and the like. Further, the imaging mode includes an AF mode for performing auto focus (hereinafter, simply called AF) and an MF mode for performing MF operation.

The cross key and the execution key are operated to display a menu screen or a setting screen on the display unit 8, move a cursor displayed in the menu screen or the setting screen, or confirm various settings of the digital camera 2.

Although not illustrated, a bottom surface of the camera body 2a includes a card slot loaded with the memory card 10 and a loading lid for opening and closing an opening of the card slot.

Figure 3:
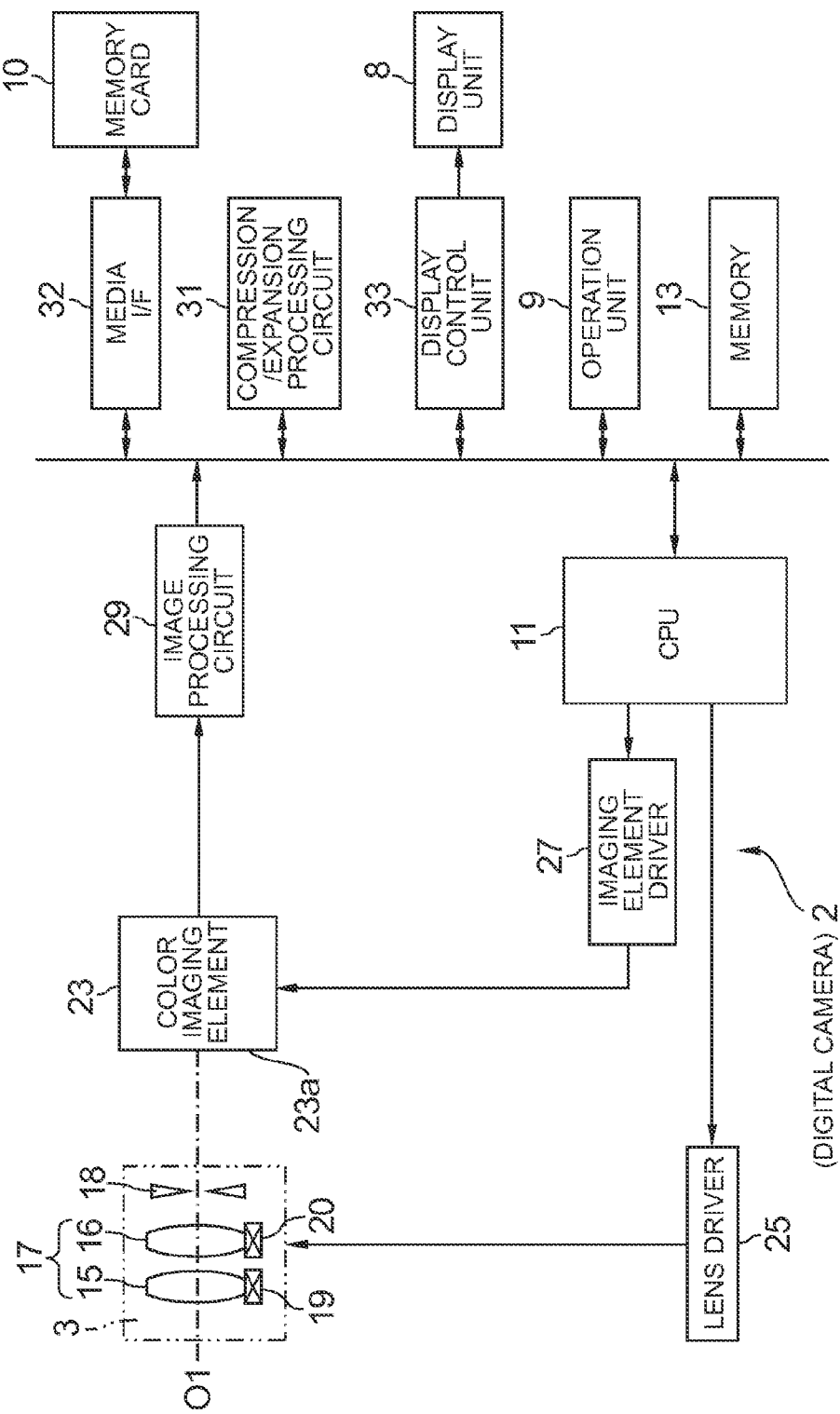
FIG. 3 is a block diagram showing an electrical configuration of the digital camera.

As shown in FIG. 3, a CPU 11 of the digital camera 2 successively executes various programs and data read from a memory 13 based on control signals from the operation unit 9 to comprehensively control the components of the digital camera 2. Note that a RAM area of the memory 13 functions as a work memory for the execution of processes by the CPU 11 or as a temporary storage location of various data.

An imaging optical system 17 including a zoom lens 15 and a focus lens 16, a mechanical shutter 18, and the like are incorporated into the lens barrel 3. The zoom lens 15 and the focus lens 16 are driven by a zoom mechanism 19 and a focus mechanism 20, respectively, and move back and forth along an optical axis 01 of the imaging optical system 17. The zoom mechanism 19 and the focus mechanism 20 include gears, motors, and the like. Further, the focus mechanism 20 is connected to the focus ring 3a through a gear not shown. Therefore, along with rotational operation (focus operation) of the focus ring 3a in the MF mode, the focus mechanism 20 moves the focus lens 16 in the direction of the optical axis 01 (hereinafter, called optical axis direction).

The mechanical shutter 18 includes a movable unit (not shown) that moves between a closed position for preventing object light from entering a color imaging element 23 and an open position for permitting the object light to enter. The mechanical shutter 18 moves the movable unit to each position to open/shut an optical path from the imaging optical system 17 and the color imaging element 23. Further, the mechanical shutter 18 includes an aperture for controlling the light amount of the object light entering the color imaging element 23. The CPU 11 operates and controls the mechanical shutter 18, the zoom mechanism 19, and the focus mechanism 20 through a lens driver 25.

The color imaging element 23 is arranged behind the mechanical shutter 18. The color imaging element 23 converts the object light passed through the imaging optical system 17 and the like into an electrical output signal and outputs the signal. Note that the color imaging element 23 may be various types of imaging elements, such as a CCD (Charge Coupled Device) type imaging element and a CMOS (Complementary Metal Oxide Semiconductor) type imaging element. An imaging element driver 27 controls the drive of the color imaging element 23 under the control of the CPU 11.

The image processing circuit 29 applies various processes, such as gradation conversion, white balance correction, and λ correction process, to the output signal (output) from theе color imaging element 23 to generate photographic image data. Further, in the MF mode, the image processing circuit 29 generates split image data for MF operation in addition to the photographic image data. The photographic image data and the split image data are temporarily stored in a VRAM (Video Random Access Memory) area of the memory 13 (VRAM may be separately provided). The VRAM area includes a memory area for live-view image that stores two consecutive field fractions and successively overwrites and stores the photographic image data and the split image data.

A compression/expansion processing circuit 31 applies a compression process to the photographic image data stored in the VRAM area when the shutter button 6 is pressed and operated. Further, the compression/expansion processing circuit 31 applies an expansion process to compressed image data obtained from the memory card 10 through a media I/F (Interface) 32. The media I/F 32 records and reads photographic image data to and from the memory card 10.

In the imaging mode, a display control unit 33 reads the photographic image data or the split image data stored in the VRAM area and successively outputs the data to the display unit 8. Further, in the reproduction mode, the display control unit 33 outputs the photographic image data expanded by the compression/expansion processing circuit 31 to the display unit 8.

<Configuration of Color Imaging Element>

Figure 4:
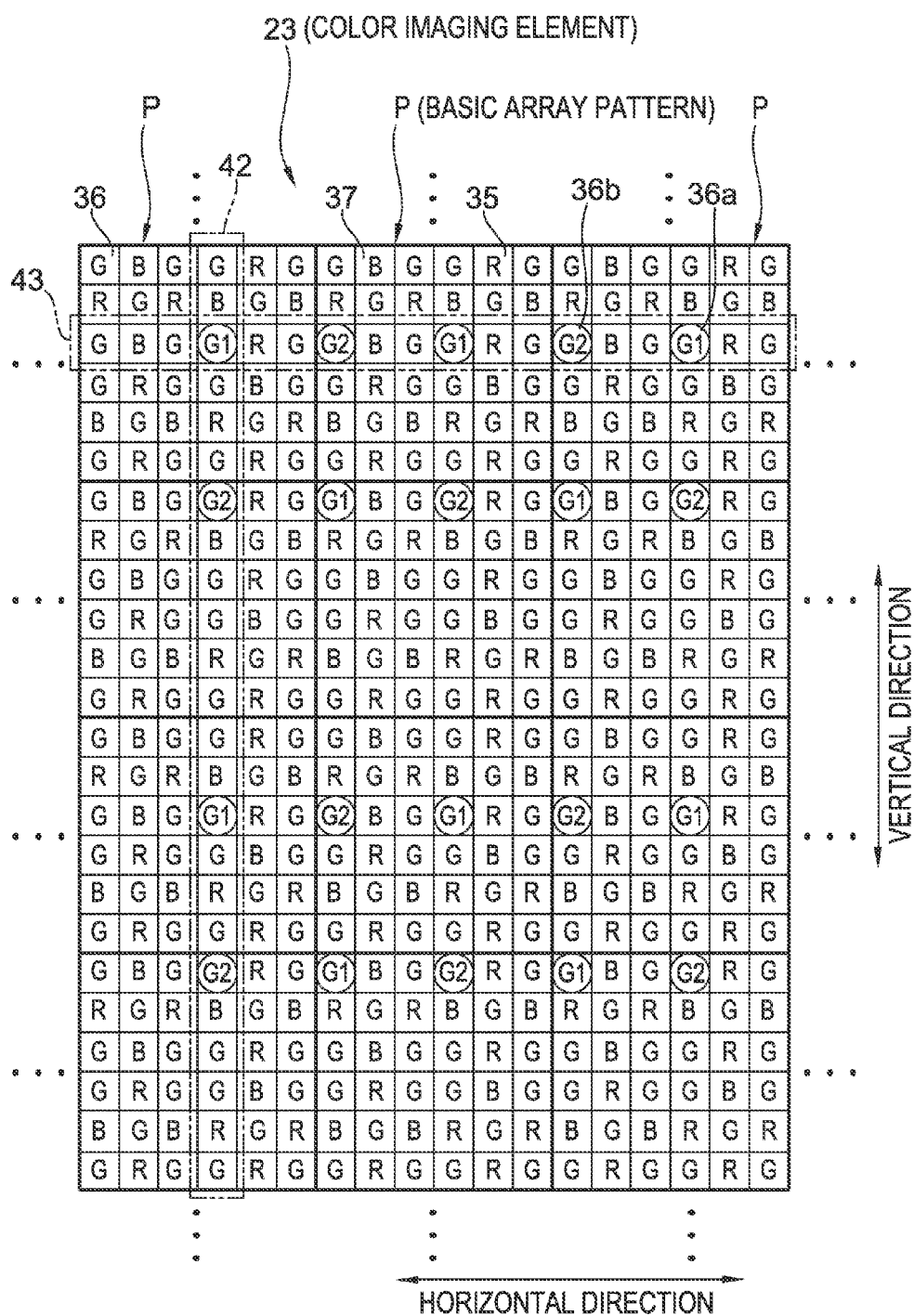
FIG. 4 is a front view of an imaging surface of a color imaging element.

As shown in FIG. 4, R pixels 35 of red (R) color, G pixels 36 of green (G) color, and B pixels 37 of blue (B) color are arranged in a matrix on an imaging surface 23a (see FIG. 3) of the color imaging element 23. Each of the color pixels 35 to 37 is equivalent to a normal pixel of the present invention and includes a photoelectric conversion element 39 (see FIG. 5) and a color filter 40 (see FIG. 5) of one of the three primary colors arranged above the photoelectric conversion element 39. Here, "on" and "above" denote a direction from a semiconductor substrate 45 in FIG. 6 toward a microlens 49 (upper direction in the drawing).

The color filters 40 of R color, G color, and B color are provided on the photoelectric conversion elements 39 of the R pixels 35, the G pixels 36, and the B pixels 37, respectively. Note that the color filters 40 of G color are equivalent to first filters of the present invention, and the color filters 40 of R color and B color are equivalent to second filters of the present invention.

A color filter array (pixel array) of the color imaging element 23 has the following features (1), (2), (3), (4), (5), and (6).

[Feature (1)]

The color filter array includes a basic array pattern P made of a square array pattern corresponding to 6×6 pixels, and the basic array pattern P is repeatedly arranged in a horizontal direction and a vertical direction.

In this way, since the color filters 40 of RGB are arranged with a predetermined periodicity, processing can be executed according to the repeated pattern when a synchronization (interpolation) process (demosaic process) or the like of R, G, and B signals read from the color imaging element 23 is executed, compared to a conventionally known random array. Further, when a thinning process is executed on the basis of the basic array pattern P to reduce an image, the color filter array after the thinning process can be the same as the color filter array before the thinning process, and common processing circuits can be used.

[Feature (2)]

In the color filter array, one or more color filters of G color corresponding to a color (color of G in this embodiment) that most contributes to obtaining a luminance signal are arranged in each line in horizontal, vertical, and oblique directions (oblique upper right and lower left directions, oblique lower right and upper left directions) directions of the color filter array.

In this way, since the color filters of G color are arranged in each line in the horizontal, vertical, and oblique directions of the color filter array, reproducibility of a pixel interpolation process (such as a synchronization process) in a high-frequency area can be improved, regardless of the direction of the high frequency.

[Feature (3)]

In the basic array pattern P, the numbers of pixels of the R pixels 35, the G pixels 36, and the B pixels 37 are 8 pixels, 20 pixels, and 8 pixels, respectively. Therefore, the ratio of the numbers of pixels of the RGB pixels 35 to 37 is 2:5:2, and the proportion of the number of pixels of the G pixels 36 is greater than the proportions of the numbers of pixels of the R pixels 35 and the B pixels 37 of other colors.

In this way, the proportion of the number of pixels of the G pixels 36 and the proportions of the numbers of pixels of the R and B pixels 35 and 37 are different, and particularly, the proportion of the number of pixels of the G pixels 36 that most contributes to obtaining the luminance signal is greater than the proportions of the numbers of pixels of the R and B pixels 35 and 37. Therefore, aliasing in a pixel interpolation process (such as a synchronization process) can be suppressed, and high-frequency reproducibility can be improved.

[Feature (4)]

In the color filter array, one or more color filters 40 of R color and B color corresponding to two or more other colors other than G color (colors of R and B in this embodiment) are arranged in each line in the horizontal and vertical directions of the color filter array in the basic array pattern P.

Since the color filters 40 of R color and B color are arranged in each line in the horizontal and vertical directions of the color filter array, generation of color moire (false color) can be reduced. As a result, an optical low-pass filter for suppressing the generation of false color does not have to be arranged in an optical path from an incident surface to an imaging surface of an optical system, or even when an optical low-pass filter is applied, an optical low-pass filter with a less effect of cutting high-frequency components for preventing the generation of false color can be applied. This can prevent degradation of the resolution.

[Feature (5)]

The color filter array includes a square array corresponding to 2×2 G pixels 36 provided with the color filters 40 of G color. The 2×2 G pixels 36 can be extracted to obtain a difference absolute value of pixel values of the G pixels 36 in the horizontal direction, a difference absolute value of pixel values of the G pixels 36 in the vertical direction, and difference absolute values of pixel values of the G pixels 36 in the oblique directions to determine that there is a correlation in a direction with a small difference absolute value among the horizontal direction, the vertical direction, and the oblique directions.

Therefore, according to the color filter array, information of the G pixels 36 at minimum pixel intervals can be used to discriminate a direction with a high correlation among the horizontal direction, the vertical direction, and the oblique directions. The direction discrimination result can be used in an interpolation process (such as a synchronization process) for interpolation from surrounding pixels.

[Feature (6)]

The basic array pattern P is point-symmetric with respect to the center (center of four color filters 40 of G color). Further, each of four 3×3 sub arrays in the basic array pattern P is also point-symmetric with respect to the color filter 40 of G color at the center. As a result of the symmetry, the circuit dimension of subsequent processing circuits can be reduced or simplified.

[Phase Difference Pixels]

On part of the areas of the imaging surface 23a (for example, center areas), first phase difference pixels 36a (displayed by "G1 in circles" in the drawing) and second phase difference pixels 36b (displayed by "G2 in circles" in the drawing) are provided in place of part of the G pixels 36. The first phase difference pixels 36a and the second phase difference pixels 36b are alternately arranged at intervals in a plurality of vertical columns (second pixel lines) 42 and a plurality of horizontal rows (first pixel lines) 43 in the pixel array of the color imaging element 23 (in the drawing, one vertical column 42 and one horizontal row 43 are representatively designated with reference numerals). Note that in the present specification, reference numerals "42" and "43" are provided to the vertical columns and the horizontal rows including the phase difference pixels, respectively, among the vertical columns and the horizontal rows of the color imaging element 23.

The "plurality of vertical columns 42" are provided at three-pixel pitch intervals in the horizontal direction (first direction). Further, the "plurality of horizontal rows 43" are provided at a four-pixel pitch interval, an eight-pixel pitch interval, a four-pixel pitch interval, an eight-pixel pitch interval . . . in the vertical direction (second direction).

In the present embodiment, the first phase difference pixels 36a and the second phase difference pixels 36b are alternately arranged in the horizontal direction and the vertical direction at positions where the vertical columns 42 and the horizontal rows 43 intersect. Note that the intervals of the same types of phase difference pixels (first phase difference pixel to first phase difference pixel, second phase difference pixel to second phase difference pixel) are a twelve-pixel pitch in the vertical direction and a six-pixel pitch in the horizontal direction.

Figure 5:
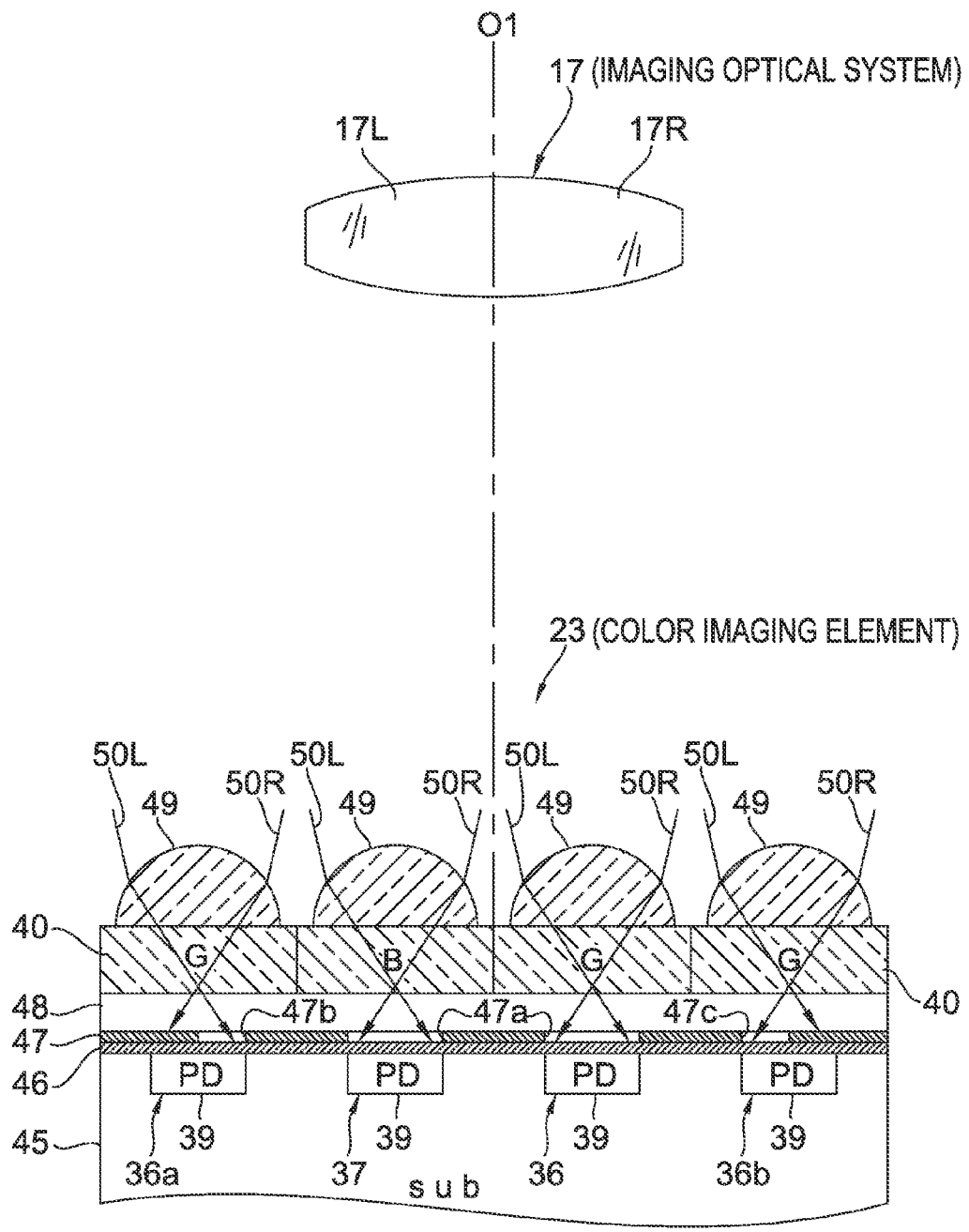
FIG. 5 is a cross-sectional view of the color imaging element.

In FIG. 5 showing a cross section of the horizontal row 43, the photoelectric conversion elements 39 are formed in a matrix on the surface layer of the semiconductor substrate (sub) 45. Note that the semiconductor substrate 45 is provided with various circuits not shown that are used to drive each pixel or to output signals.

A light-transmitting insulating film 46 is provided on the semiconductor substrate 45. A light shielding film 47 is provided on the insulating film 46. The light shielding film 47 includes a normal opening 47a, a first eccentric opening 47b, and a second eccentric opening 47c. The first and second eccentric openings 47b and 47c are formed with smaller opening diameters than the opening diameter of the normal opening 47a.

The normal openings 47a are formed on the photoelectric conversion elements 39 of the RGB pixels 35 to 37. Further, the centers of the normal openings 47a are positioned at the centers of the photoelectric conversion elements 39.

The first eccentric openings 47b are formed on the photoelectric conversion elements 39 of the first phase difference pixels 36a. The centers of the first eccentric openings 47b are deviated rightward in the drawing with respect to the centers of the photoelectric conversion elements 39 below. As a result, substantially left half areas (hereinafter, simply called left areas) of the photoelectric conversion elements 39 of the first phase difference pixels 36a are covered by the light shielding film 47, and conversely, center sections of substantially right half areas (hereinafter, simply called right areas) are exposed.

The second eccentric openings 47c are formed on the photoelectric conversion elements 39 of the second phase difference pixels 36b. The centers of the second eccentric openings 47c are formed at positions deviated rightward in the drawing with respect to the centers of the photoelectric conversion elements 39 below. As a result, right areas of the photoelectric conversion elements 39 of the second phase difference pixels 36b are covered by the light shielding film 47, and conversely, center sections of left areas are exposed.

A light-transmitting planarization layer 48 with a flat surface is provided on the light shielding film 47. The color filters 40 of each color of R, G, and B are provided on the planarization layer 48, at positions corresponding to the pixels 35 to 37 of each color of R, G, and B. Further, the color filters 40 of G color are provided at positions corresponding to the first and second phase difference pixels 36a and 36b.

Microlenses 49 are provided on the color filters 40 of each color, at positions above the photoelectric conversion elements 39. Note that various layers, such as a translucent flat layer, are also provided between the color filters 40 and the microlenses 49.

The microlenses 49 condense object light 50L entering the microlenses 49 on the RGB pixels 35 to 37 from the left oblique direction in the drawing, in the right areas of the photoelectric conversion elements 39. Conversely, the microlenses 49 condense object light 50R entering the microlenses 49 from the right oblique direction in the drawing, in the left areas of the photoelectric conversion elements 39. Therefore, the RGB pixels 35 to 37 have high sensitivity with respect to both of the object light 50L and the object light 50R.

The microlenses 49 condense the object light 50L entering the microlenses 49 on the first phase difference pixels 36a, in the right areas of the photoelectric conversion elements 39 through the first eccentric openings 47b. Conversely, the object light 50R entering the microlenses 49 is blocked by the light shielding film 47 and is not condensed in the left areas of the photoelectric conversion elements 39.

The microlenses 49 condense the object light 50R entering the microlenses 49 on the second phase difference pixels 36b, in the left areas of the photoelectric conversion elements 39 through the second eccentric openings 47c. Conversely, the object light 50R entering the microlenses 49 is blocked by the light shielding film 47 and is not condensed in the left areas of the photoelectric conversion elements 39. Therefore, the light shielding film 47 functions as a pupil division unit that performs pupil division. Note that instead of causing the light shielding film 47 (eccentric openings 47b and 47c) to function as a pupil division unit, the microlenses 49 may be eccentric.

The object lights 50L and 50R are object lights that have passed through a left area 17L and a right area 17R of the imaging optical system 17 (zoom lens 15 and focus lens 16), respectively. Note that both lenses 15 and 16 are integrally illustrated to prevent the complication of the drawing, and the sizes of the imaging optical system 17 and the color imaging element 23 are different from the actual sizes.

As a result of the pupil division of the object light entering the color imaging element 23 by the light shielding film 47, the sensitivity of the first phase difference pixels 36a increases with respect to the object light 50L, and conversely, the sensitivity of the second phase difference pixels 36b increases with respect to the object light 50R.

<Configuration of Image Processing Circuit>

Figure 6:
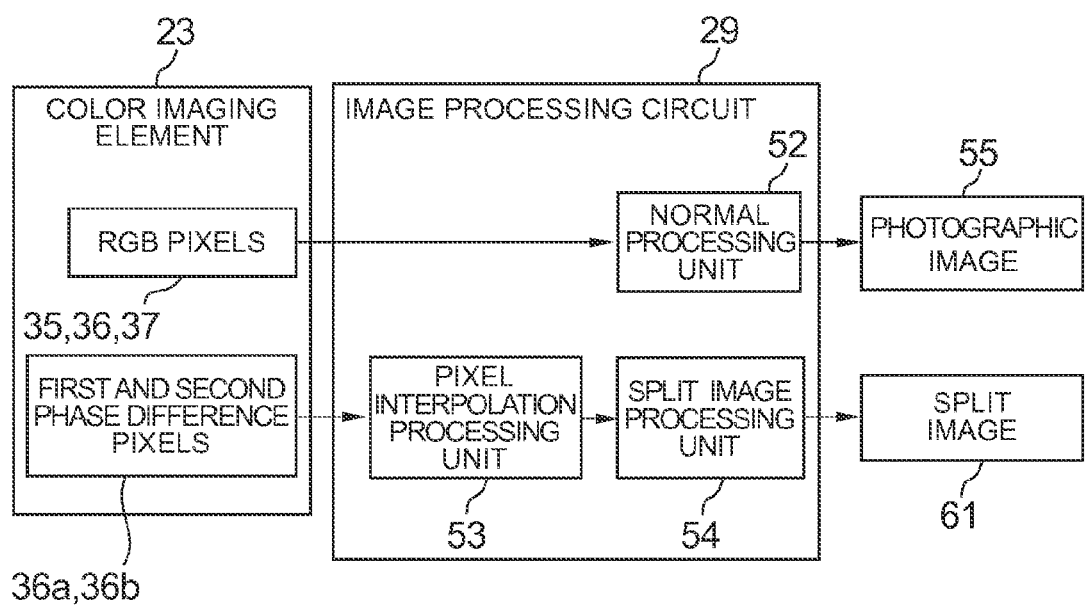
FIG. 6 is a block diagram showing an electrical configuration of an image processing circuit.

As shown in FIG. 6, the image processing circuit 29 includes a normal processing unit (photographic image generation device) 52, a pixel interpolation processing unit (first interpolation device, second interpolation device) 53, and a split image processing unit (split image generation device) 54. The normal processing unit 52 generates full-color photographic image data 55 based on output signals (outputs) from the RGB pixels 35 to 37 in the imaging mode. The pixel interpolation processing unit 53 and the split image processing unit 54 operate in the MF mode.

Figure 7:
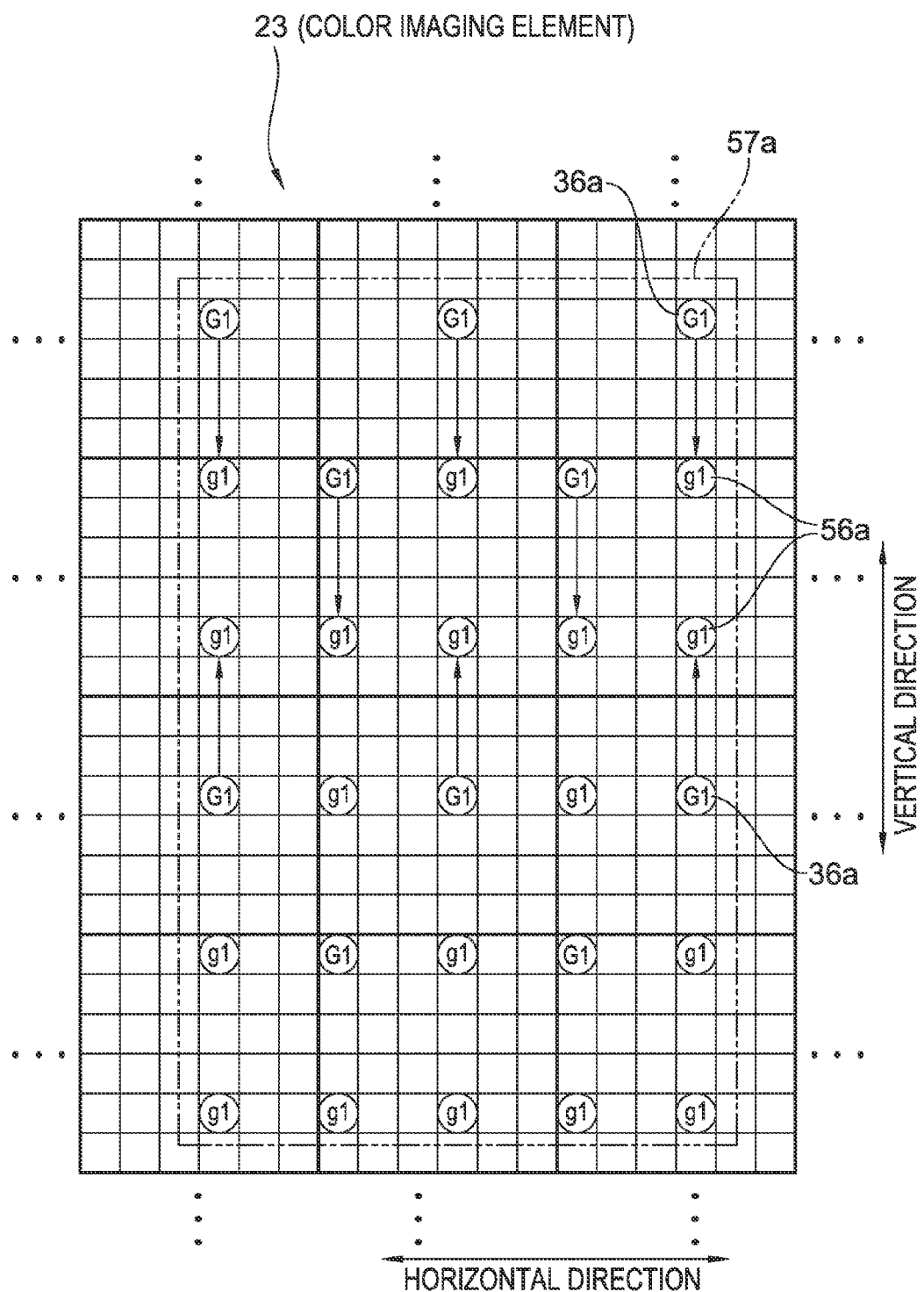
FIG. 7 is an explanatory view for explaining an interpolation process of first phase difference pixels.
Figure 8:
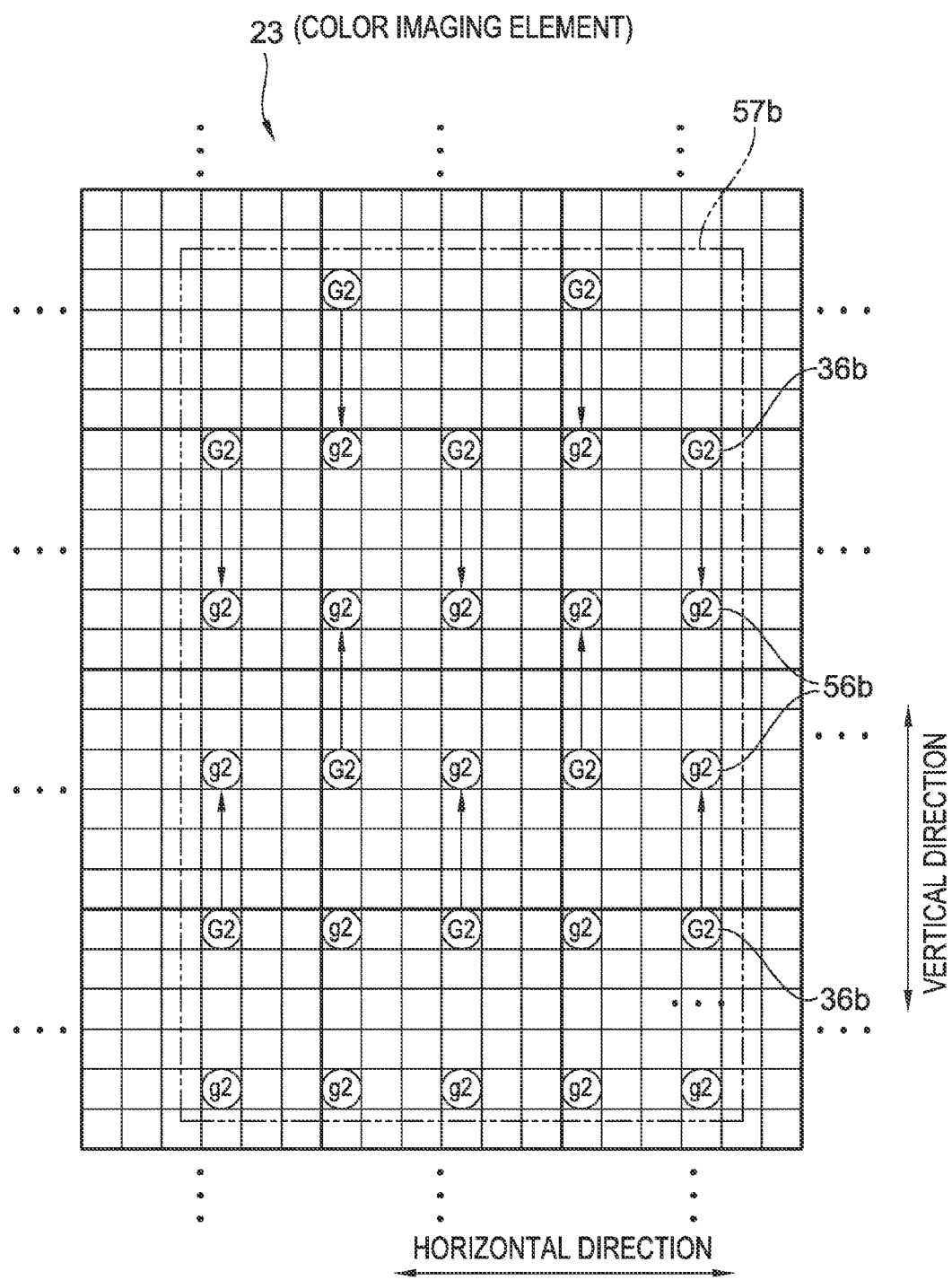
FIG. 8 is an explanatory view for explaining an interpolation process of second phase difference pixels.

As shown in FIG. 7 and FIG. 8, the pixel interpolation processing unit 53 executes an interpolation process of the first phase difference pixels 36a and the second phase difference pixels 36b in each vertical column 42. In FIG. 7, pixels other than the first phase difference pixels 36a are not illustrated. Further, in FIG. 8, pixels other than the second phase difference pixels 36a are not illustrated.

In FIG. 7, the pixel interpolation processing unit 53 virtually interpolates one or more first interpolation pixels 56a (displayed "g1 in circles" in the drawing) between two vertical first phase difference pixels 36a in the drawing in each vertical column 42 based on the output of each first phase difference pixel 36a in each vertical column 42 and obtains outputs of the first interpolation pixels 56a. Specifically, the first interpolation pixels 56a are interpolated between two first phase difference pixels 36a so that the first phase difference pixels 36a and the first interpolation pixels 56a are arranged at equal intervals (four-pixel pitch intervals in the present embodiment) in the vertical direction in each vertical column 42.

In this case, as indicated by arrows in the drawing for example, the outputs of the first interpolation pixels 56a are determined based on the outputs of the first phase difference pixels 36a positioned near the first interpolation pixels 56a. Note that an average value of two vertical first phase difference pixels 36a may be the output of the first interpolation pixels 56a positioned between them. In this way, outputs of a first pixel group 57a including the first phase difference pixels 36a and the first interpolation pixels 56a are obtained. Note that although the example of FIG. 7 illustrates two first interpolation pixels 56a between two vertical first phase difference pixels 36a, it is only necessary that the number of first interpolation pixels 56a be one or more.

In FIG. 8, the pixel interpolation processing unit 53 executes an interpolation process of virtually interpolating one or more second interpolation pixels 56b (indicated by "g2 in circles" in the drawing) between two vertical second phase difference pixels 36b in the drawing in each vertical column 42 based on the outputs of the second phase difference pixels 36b in each vertical column 42 and obtaining outputs of the second interpolation pixels 56b. Specifically, the second interpolation pixels 56b are interpolated between two second phase difference pixels 36b so that the second phase difference pixels 36b and the second interpolation pixels 56b are arranged at equal intervals (four-pixel pitch intervals in the present embodiment) in the vertical direction in each vertical column 42.

Like the outputs of the first interpolation pixels 56a, the outputs of the second interpolation pixels 56b are determined based on the outputs of the second phase difference pixels 36b positioned near the second interpolation pixels 56b as indicated by arrows in the drawing. Note that an average value of two second phase difference pixels 36b may be the output of the second interpolation pixels 56b positioned between them. In this way, outputs of a second pixel group 57b including the second phase difference pixels 36b and the second interpolation pixels 56b are obtained. Note that the example of FIG. 8 illustrates two second interpolation pixels 56b between two vertical second phase difference pixels 36b, it is only necessary that the number of second interpolation pixels 56a be one or more.

Returning to FIG. 6, the split image processing unit 54 generates black and white split image data 61 of a center area of an object (center area of photographic image) based on luminance components of output signals (outputs) from the first and second pixel groups 57a and 57b positioned at the center area of the imaging surface 23a.

Figure 9:
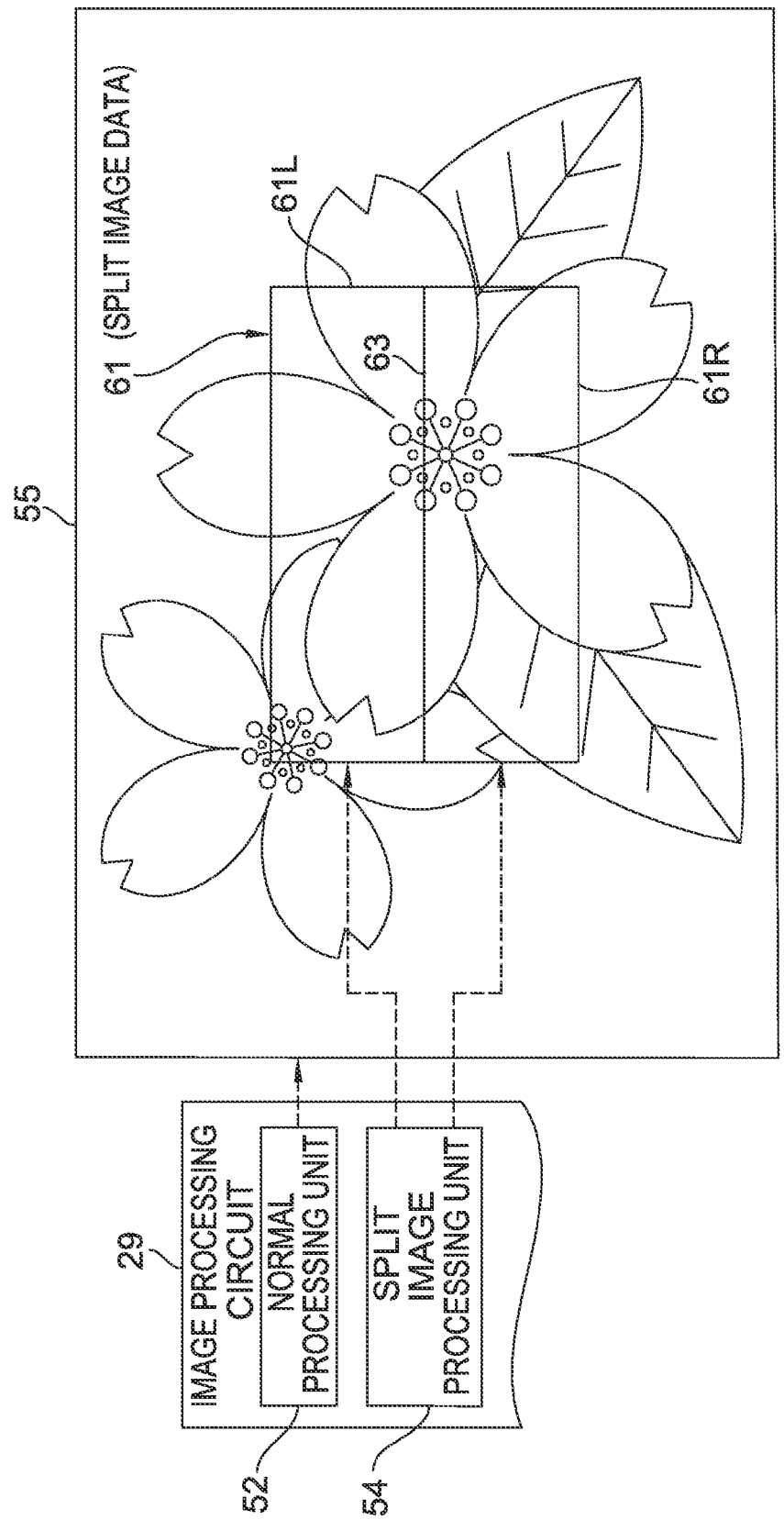
FIG. 9 is a schematic view of split image data when a focus lens is set to a focusing position.

As shown in FIG. 9, the split image processing unit 54 generates black and white first image data 61L viewing an upper half area of the center area of the object in the drawing from an L viewpoint side based on the luminance components of the output signals (outputs) from the first pixel group 57a. Further, the split image processing unit 54 generates black and white second image data 61R viewing a lower half area of the center area of the object in the drawing from an R viewpoint side based on the luminance components of the output signals (outputs) from the second pixel group 57b. In this way, the black and white split image data 61 including the first image data 61L and the second image data 61R is obtained. The first and second image data 61L and 61R are divided by a division line 63 parallel to the horizontal direction in the split image data 61. Note that the split image data 61 is synthesized with the photographic image data 55 in the drawing to allow easily figuring out the image of the split image data 61, and the display control unit 33 performs this synthesis.

The photographic image data 55 and the split image data 61 are temporarily stored in the VRAM area of the memory 13. The display control unit 33 reads the photographic image data 55 and the split image data 61 from the memory 13 to synthesize the split image data 61 with the photographic image data 55 and then outputs the data to the display unit 8. In this way, a live-view image displaying a black and white split image based on the split image data 61 is obtained in a display area of a full-color photographic image based on the photographic image data 55.

The first image data 61L and the second image data 61R shift in the left-right direction [horizontal direction (first direction)] in the drawing according to the focus state of the focus lens 16. A deviation amount between the first and second image data 61L and 61R in this case corresponds to a deviation amount of the focus of the focus lens 16. Therefore, the left-right direction in the drawing is a phase difference direction corresponding to a deviation direction of images of each object light formed by the imaging optical system 17 on the imaging surface 23a. Further, the deviation amount of the first and second image data 61L and 61R is zero (including substantially zero) when the focus lens 16 is in focus.

Figure 10:
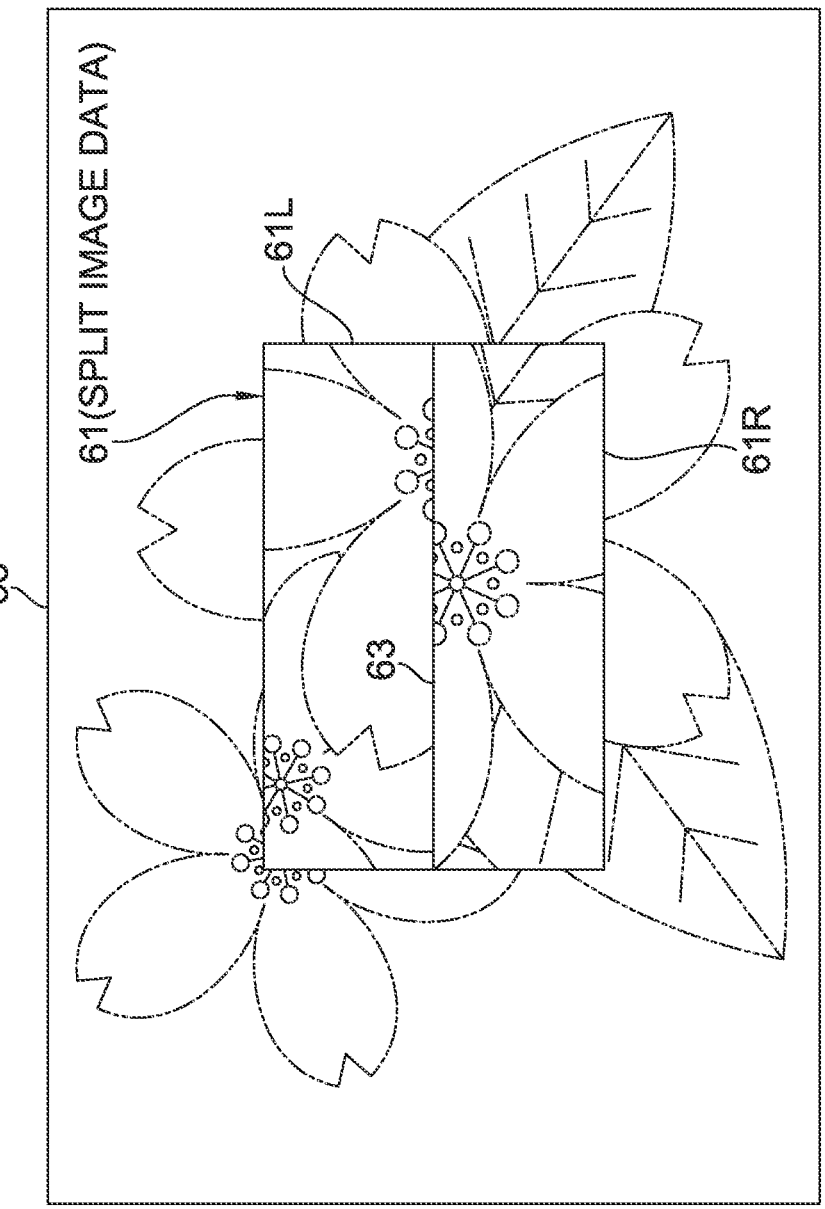
FIG. 10 is a schematic view of split image data when the focus lens is not set to the focusing position.

As shown in FIG. 10, the deviation amount of the first image data 61L and the second image data 61R increases with an increase in the deviation of the focus of the focus lens 16. This allows the user to perform the focus adjustment while checking the live-view image. Note that an object out of focus is displayed by alternate long and two short dashes lines in the drawing.

<Other Configurations>

Note that although not illustrated, the digital camera 2 includes an AF detection circuit for auto focus and the like. The AF detection circuit analyzes an image formed by output signals of the first phase difference pixels 36a and an image formed by output signals of the second phase difference pixel 36b to detect a deviation direction of both images and a deviation amount of both images to thereby obtain a focus adjustment amount (also called defocus amount) of the imaging optical system 17. Based on the focus adjustment amount, the CPU 11 controls the lens driver 25 to drive the focus lens 16 by the focus mechanism 20 to perform the focus adjustment. Note that the AF process of the phase difference system is well-known, and specific explanation is omitted here.

Further, although not illustrated, the digital camera 2 includes an AE detection circuit and the like. The CPU 11 drives the mechanical shutter 18 through the lens driver 25 based on a detection result of the AE detection circuit to execute an AE process.

<Action of Digital Camera of First Embodiment>

Figure 11:
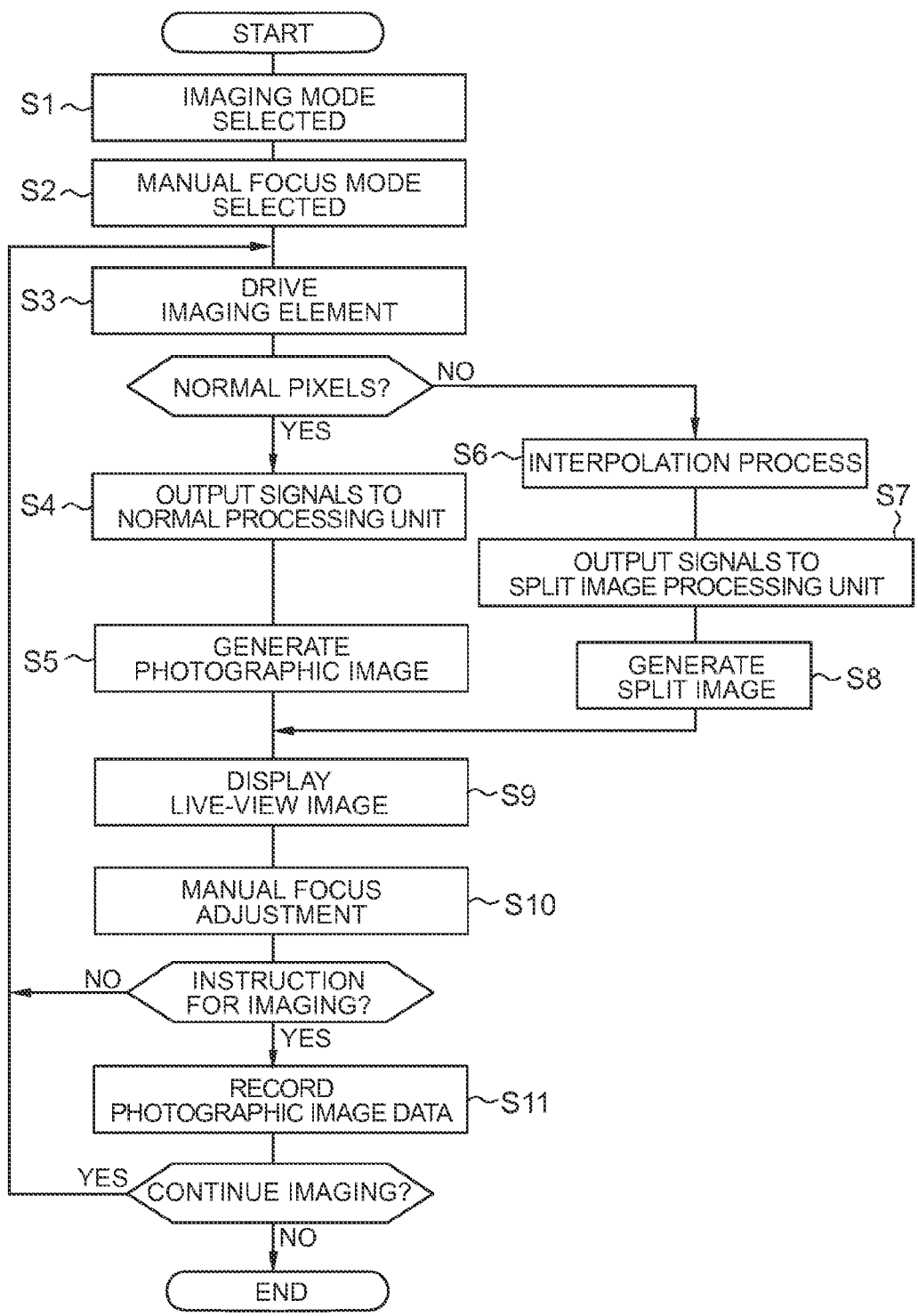
FIG. 11 is a flow chart showing a flow of an imaging process of the digital camera.

Next, an action of the digital camera 2 with the configuration is explained with reference to FIG. 11. When the digital camera 2 is set to the AF mode or the MF mode (step S2) of the imaging mode (step S1) by the operation unit 9, the CPU 11 controls the operation of the mechanical shutter 18 through the lens driver 25 and drives the color imaging element 23 through the imaging element driver 27 (step S3). Note that the operation of the digital camera 2 when the AF mode is set is well-known, and specific explanation is omitted here.

When the MF mode (step S2) is set, the output signals from the RGB pixels 35 to 37 of the color imaging element 23 are input to the normal processing unit 52 of the image processing circuit 29 (step S4). The normal processing unit 52 generates the full-color photographic image data 55 based on the output signals from the RGB pixels 35 to 37 and stores the data in the VRAM area of the memory 13 (step S5).

On the other hand, the output signals from the first and second phase difference pixels 36a and 36b are input to the pixel interpolation processing unit 53. As shown in FIG. 7, the pixel interpolation processing unit 53 obtains the output signals of the first interpolation pixels 56a between two vertical first phase difference pixels 36a in each vertical column 42 based on the output signals of the first phase difference pixels 36a. Further, as shown in FIG. 8, the pixel interpolation processing unit 53 obtains the output signals of the second interpolation pixels 56b between two vertical second phase difference pixels 36b in each vertical column 42 based on the output signals of the second phase difference pixels 36b. In this way, the output signals of the first pixel group 57a and the output signals of the second pixel group 57b are obtained (step S6). The output signals of the first and second pixel groups 57a and 57b are input to the split image processing unit 54 (step S7).

The split image processing unit 54 generates the first image data 61L based on the luminance components of the output signals from the first pixel group 57a and generates the second image data 61R based on the luminance components of the output signals from the second pixel group 57b. In this way, the split image data 61 including the black and white first image data 61L and the black and white second image data 61R is generated (step S8). The split image data 61 is stored in the VRAM area of the memory 13.

Figure 12:
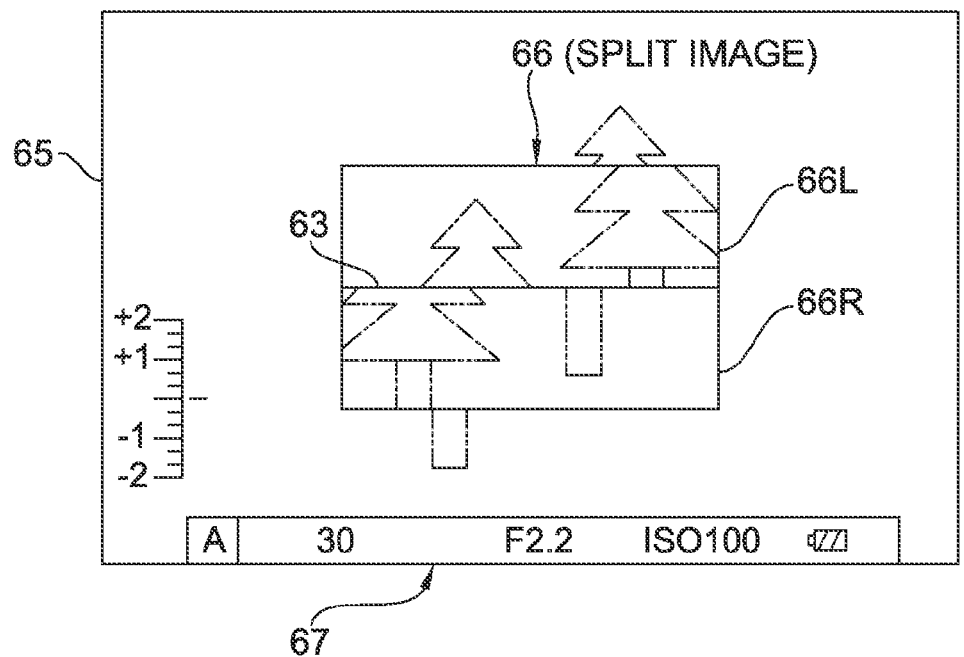
FIG. 12 is a schematic view of a live-view image when the focus lens is not set to a focusing position.

The display control unit 33 reads the photographic image data 55 and the split image data 61 from the memory 13 to synthesize the photographic image data 55 and the split image data 61 and then outputs the data to the display unit 8. In this way, as shown in FIG. 12, the display unit 8 displays a live-view image 67 including a black and white split image 66 based on the split image 61 in a full-color photographic image 65 based on the photographic image data 55 (step S9).

A first image 66L and a second image 66R of the split image 66 shift in the left-right direction in the drawing according to the focus state of the focus lens 16, and the user rotates and operates the focus ring 3a to move the focus lens 16 in the optical axis direction. The deviation amount of the first image 66L and the second image 66R gradually decreases as the focus lens 16 approaches the focusing position where the object is focused. In this way, the user can perform the focus adjustment while checking the live-view image 67.

Figure 13:
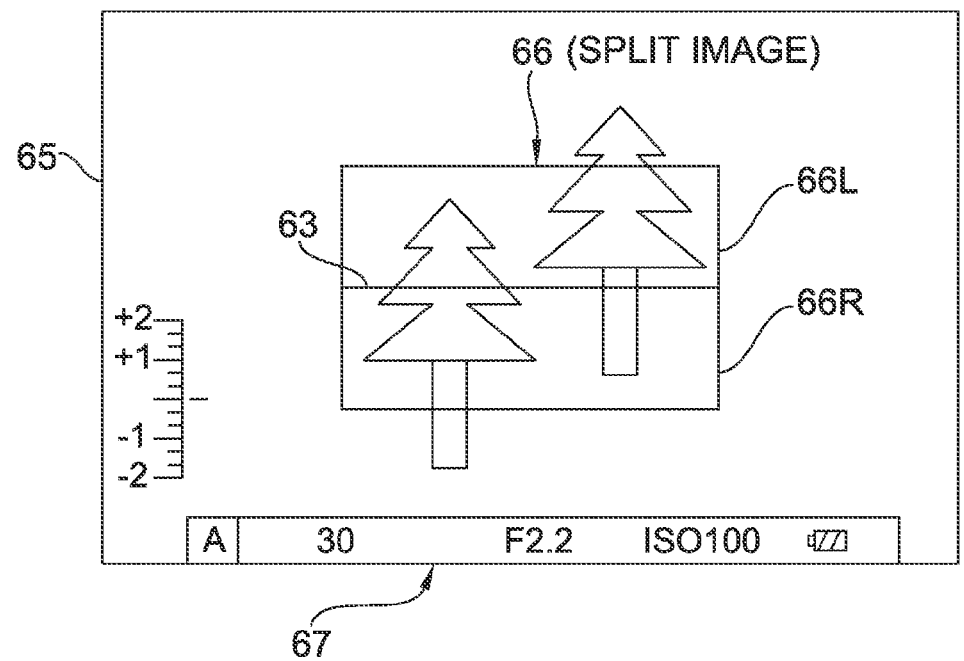
FIG. 13 is a schematic view of the live-view image when the focus lens is set to the focusing position.

As shown in FIG. 13, when the focus lens 16 is set to the focusing position, the deviation amount of the first image 66L and the second image 66R becomes zero. In this way, the focus lens 16 focuses the object, and the focus adjustment is completed (step S10). Thereafter, the process is repeatedly executed until the shutter button 6 is pressed.

When the shutter button 6 is pressed, the normal processing unit 52 generates the photographic image data 55 of one frame and temporarily stores the data in the VRAM area of the memory 13. The photographic image data 55 is compressed by the compression/expansion processing circuit 31 and then recorded in the memory card 10 through the media I/F 32 (step S11). Thereafter, the process is repeatedly executed until the MF mode is finished.

<Effects of Digital Camera>

In the present embodiment, the first and second phase difference pixels 36a and 36b are provided in each vertical column 42 of the color imaging element 23, and the split image data 61 is generated based on the output signals of the first and second pixel groups 57a and 57b obtained by virtually interpolating the first and second interpolation pixels 56a and 56b in each vertical column 42. Therefore, the split image data 61 is generated by the outputs of the phase difference pixels 36a and 36b and the interpolation pixels 56a and 56b in each of the same vertical columns 42. In this way, compared to the conventional techniques in which the first and second phase difference pixels corresponding to each other are not provided in each of the same vertical columns (see FIG. 2 of PTL 3 and FIG. 2 of PTL 4), the phase difference display based on the split image 66 (first image 66L and second image 66R) can be more accurately performed. As a result, the manual focus adjustment can be more highly accurately performed than in the conventional techniques.

Further, the virtual interpolation of the first and second interpolation pixels 56a and 56b can reduce the numbers of the first and second phase difference pixels 36a and 36b provided to the imaging surface. This can increase the RGB pixels 35 to 37 used to generate the photographic image 65.

Further, since the first and second interpolation pixels 56a and 56b are interpolated so that the pixels of the first pixel group 57a and the second pixel group 57b are arranged at equal intervals in the vertical direction in each vertical column 42, jaggies of the split image 66 can be reduced. Furthermore, since the split image data 61 can be easily generated by arranging the pixels of the first pixel group 57a and the second pixel group 57b at equal intervals in the vertical direction, the image quality of the split image 66 is further improved, and the focus adjustment can be easily performed.

Further, the split image 66 is displayed by a black and white image in the full-color photographic image 65 (live-view image 67), and the user can easily recognize the split image 66.

[Overall Configuration of Digital Camera of Second Embodiment]

Figure 14:
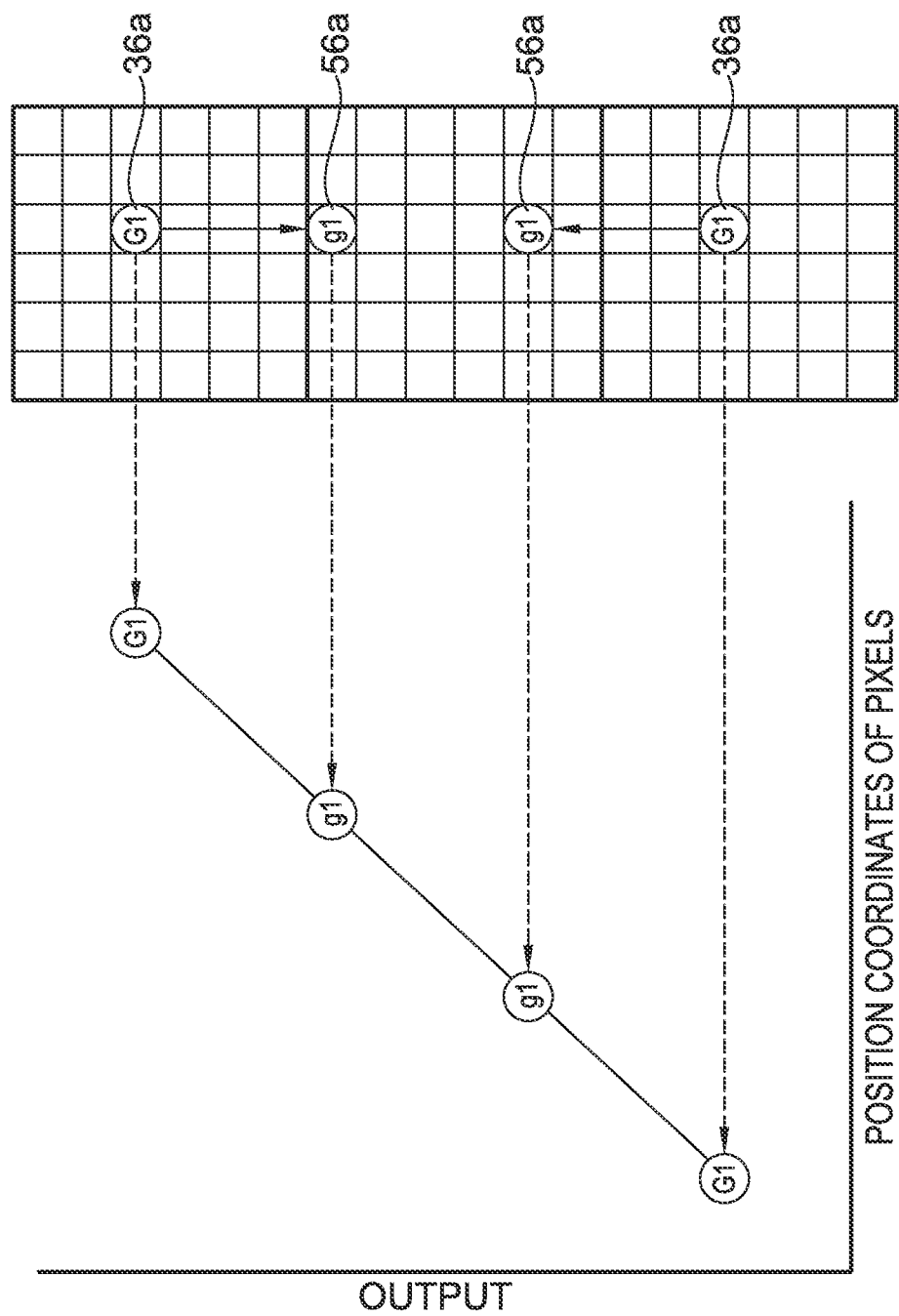
FIG. 14 is an explanatory view for explaining a pixel interpolation process of a digital camera of a second embodiment.

Next, a digital camera of a second embodiment of the present invention is explained with reference to FIG. 14. Although the determination method of the outputs of the first and second interpolation pixels 56a and 56b is not particularly limited in the pixel interpolation processing unit 53 of the digital camera 2 of the first embodiment, the outputs of the first and second interpolation pixels 56a and 56b are obtained by interpolation based on a linear interpolation method in the digital camera of the second embodiment.

Note that the digital camera of the second embodiment basically has the same configuration as the digital camera 2 of the first embodiment. Therefore, the same functions and configurations as in the first embodiment are designated with the same reference numerals, and the explanation is omitted.

The pixel interpolation processing unit 53 determines the outputs of the first interpolation pixels 56a based on the outputs and position coordinates of the first phase difference pixels 36a and position coordinates of the first interpolation pixels 56a. Specifically, based on the outputs and the position coordinates, the outputs of the first interpolation pixels 56a are determined so that the outputs of the first interpolation pixels 56a positioned between two vertical first phase difference pixels 36a are values on a line segment connecting the outputs of the two vertical first phase difference pixels 36a. Note that although not illustrated, the outputs of the second interpolation pixels 56b are also determined in the same way.

In this way, the outputs of the first and second interpolation pixels 56a and 56b are optimized by obtaining the outputs of the first and second interpolation pixels 56a and 56b by the interpolation based on the linear interpolation method. As a result, the image quality of the split image 66 is improved, and the MF adjustment can be easily performed.

[Configuration of Digital Camera of Third Embodiment]

Figure 15:
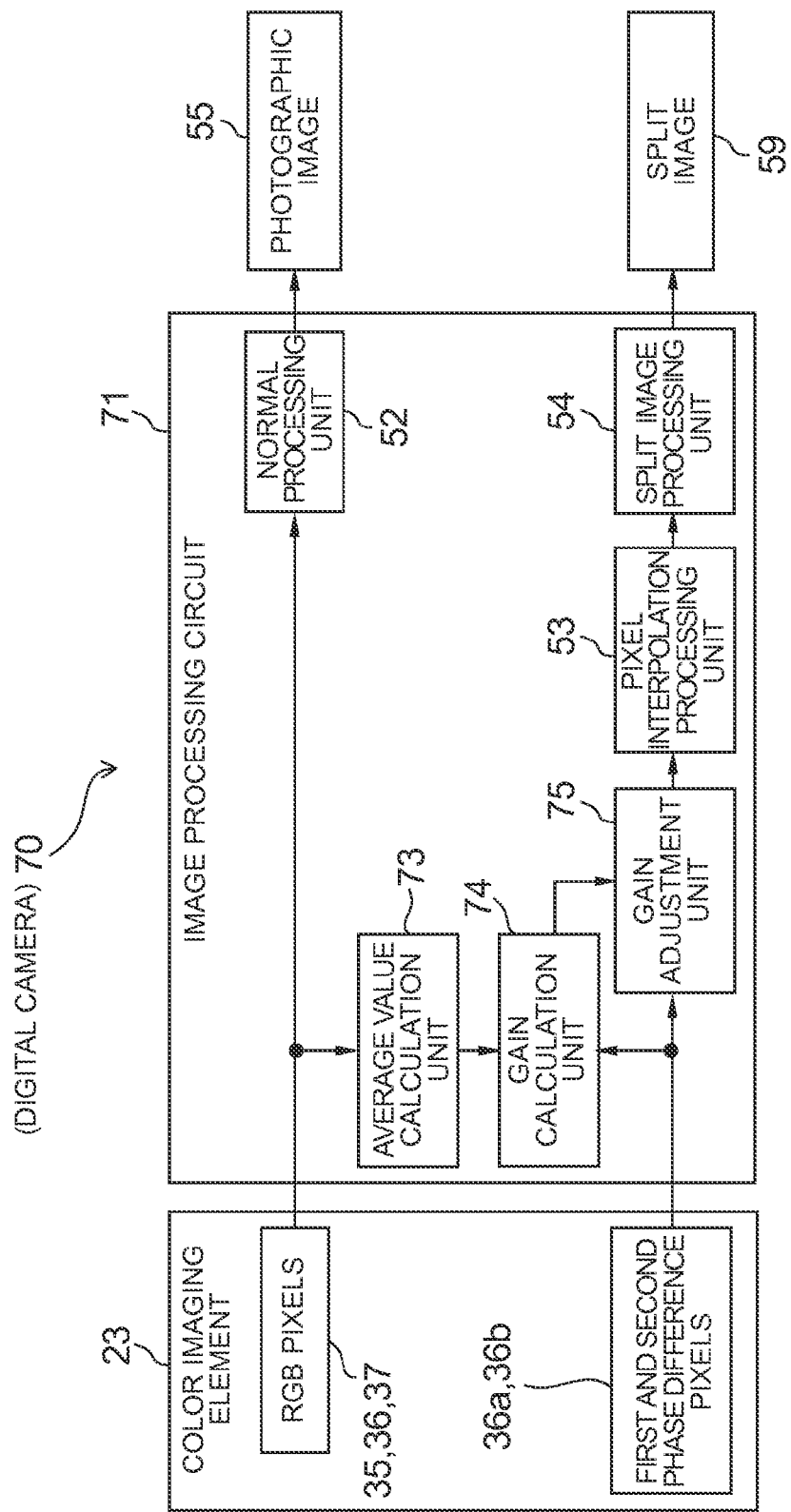
FIG. 15 is a block diagram showing an electrical configuration of a digital camera of a third embodiment.

Next, a digital camera 70 of a third embodiment of the present invention is explained with reference to FIG. 15. In the digital camera 2 of the first embodiment, the sensitivities of the first and second phase difference pixels 36a and 36b are lower than the sensitivities of the RGB pixels 35 to 37 due to the pupil division. Therefore, the digital camera 70 of the third embodiment performs gain adjustment of the outputs of the first and second phase difference pixels 36a and 36b.

Note that the digital camera 70 basically has the same configuration as the digital camera 2 of the first embodiment except that an image processing circuit 71 different from the first embodiment is included. Therefore, the same functions and configurations as in the first embodiment are designated with the same reference numerals, and the explanation is omitted.

The image processing circuit 71 includes an average value calculation unit 73, a gain calculation unit (comparison device) 74, and a gain adjustment unit (gain adjustment device) 75, in addition to the normal processing unit 52, the pixel interpolation processing unit 53, and the split image processing unit 54.

The average value calculation unit 73 calculates an average value PGave of the outputs of the G pixels 36 and outputs the average value PGave to the gain calculation unit 74. The gain calculation unit 74 compares average values PG1 and PG2 of the outputs of the first and second phase difference pixels 36a and 36b with the average value PGave to determine gains GA1 and GA2 to be applied to the outputs of the first and second phase difference pixels 36a and 36b. Specifically, the gains GA1 and GA2 are determined based on the following Formulas (1) and (2), and the gains GA1 and GA2 are output to the gain adjustment unit 75.

$$\text{Gain } GA1 = PGave/PG1 \quad \text{(Formula 1)}$$

$$\text{Gain } GA2 = PGave/PG2 \quad \text{(Formula 2)}$$

The gain adjustment unit 75 performs gain adjustment for applying the gains GA1 and GA2 to the outputs of the first and second phase difference pixels 36a and 36b, respectively, and then outputs the outputs of the first and second phase difference pixels 36a and 36b after the gain adjustment to the split image processing unit 54.

[Action of Digital Camera of Third Embodiment]

Figure 16:
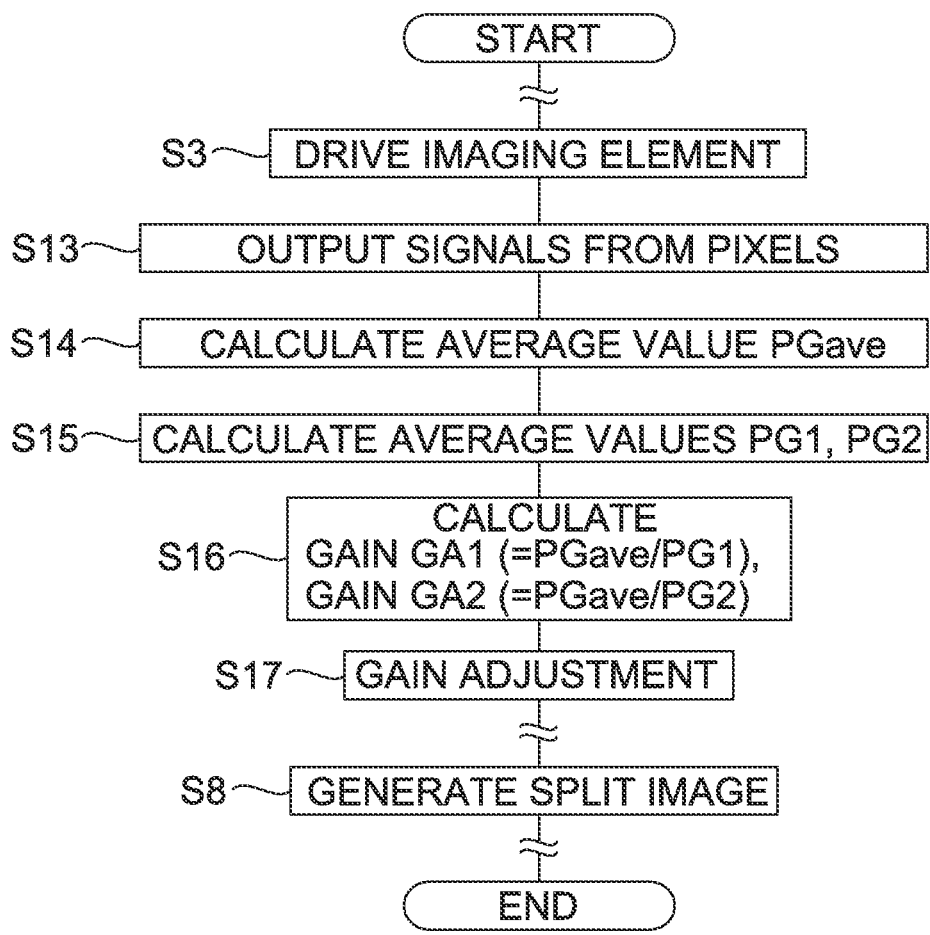
FIG. 16 is a flow chart showing a flow of a split image generation process in the third embodiment.

Next, an action of the digital camera 70 with the configuration is explained with reference to FIG. 16. Note that the processes other than the generation process of the split image data 61 are the same as in the first embodiment, and the description is omitted here.

When the color imaging element 23 is driven (step S3), output signals are output from the RGB pixels 35 to 37 and the first and second phase difference pixels 36a and 36b (step S13). The average value calculation unit 73 detects the output signals of the G pixels 36 from the output signals input to the normal processing units 52 from the RGB pixels 35 to 37 and calculates the average value PGave (step S14). The average value PGave is output to the gain calculation unit 74.

Further, the gain calculation unit 74 detects the output signals input to the pixel interpolation processing unit 53 from the first and second phase difference pixels 36a and 36b and calculates the average values PG1 and PG2 (step S15). Next, the gain calculation unit 74 uses the Formulas (1) and (2) to determine the gains GA1 and GA2 based on the average value PGave as well as the average values PG1 and PG2 (step S16). The gains GA1 and GA2 are input to the gain adjustment unit 75.

The gain adjustment unit 75 applies the gains GA1 and GA2 to the outputs of the first and second phase difference pixels 36a and 36b, respectively. As a result of the gain adjustment, the outputs of the first and second phase difference pixels 36a and 36b with low sensitivities become the same (including substantially the same) as the outputs of the G pixels 36 (step S17). The outputs of the first and second phase difference pixels 36a and 36b after the gain adjustment are input to the pixel interpolation processing unit 53. Thereafter, the split image data 61 is generated as in the first embodiment (step S8).

The gain adjustment of the outputs of the first and second phase difference pixels 36a and 36b eliminates the luminance difference between the photographic image 65 and the split image 66 when the split image 66 is displayed on part of the photographic image 65 in picture-in-picture display. As a result, a high-quality live-view image 67 without discomfort is displayed.

Note that although the gain adjustment is performed based on the outputs of the G pixels 36 and the outputs of the first and second phase difference pixels 36a and 36b in the third embodiment, the gain adjustment may be performed based on the luminances of the RGB pixels 35 to 37 and the luminances of the first and second phase difference pixels 36a and 36b.

[Configuration of Digital Camera of Fourth Embodiment]

Figure 17:
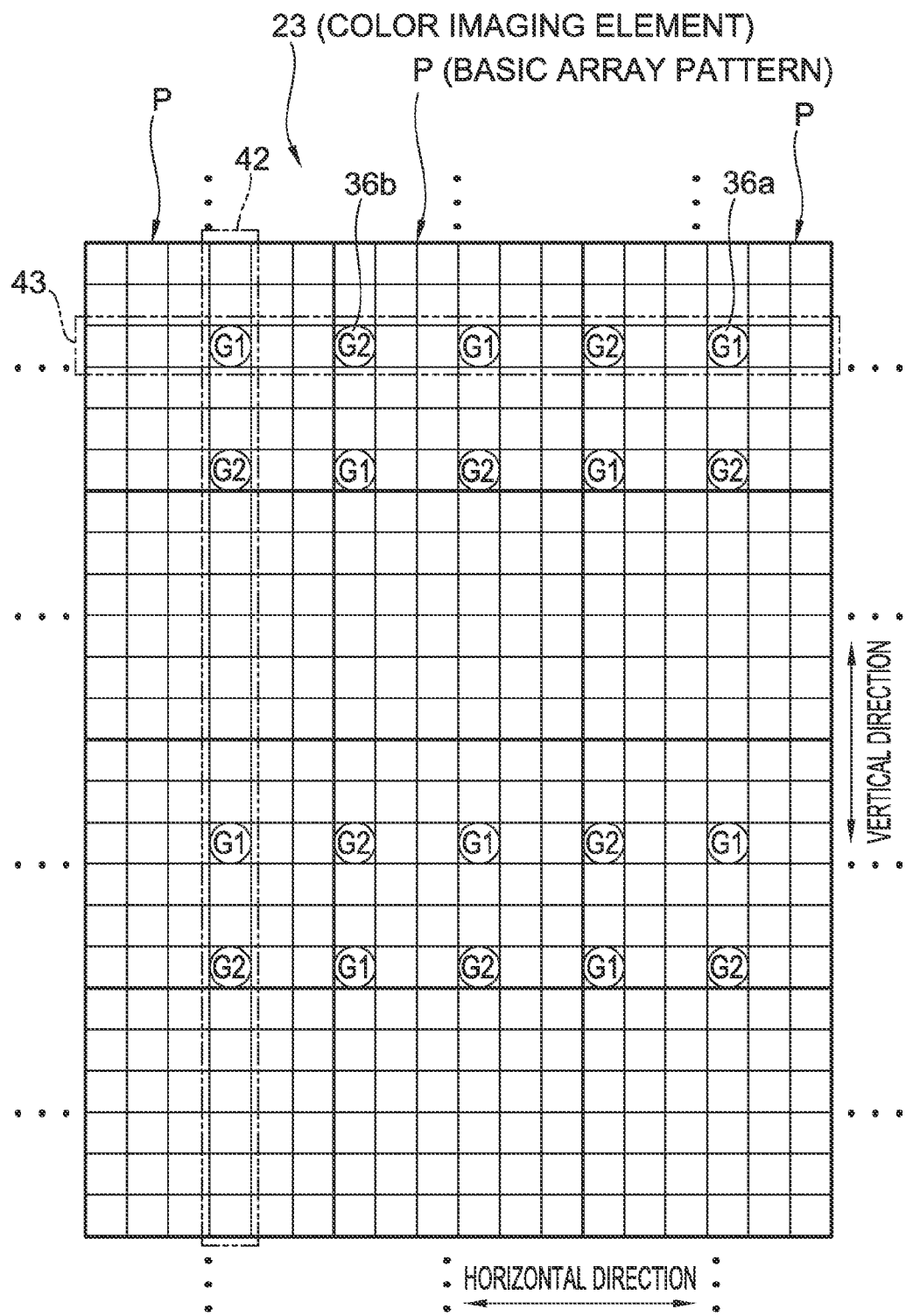
FIG. 17 is an explanatory view for explaining an array of the first and second phase difference pixels on the imaging surface of the color imaging element of a digital camera of a fourth embodiment.

Next, a digital camera of a fourth embodiment of the present invention is explained with reference to FIG. 17. The pixel interpolation processing unit 53 of the digital camera 2 of the first embodiment virtually interpolates the first interpolation pixels 56a and the second interpolation pixels 56b between two vertical first phase difference pixels 36a and between the second phase difference pixels 36b, respectively, to obtain the outputs of the first interpolation pixels 56a and the second interpolation pixels 56b. Meanwhile, the digital camera of the fourth embodiment virtual interpolates interpolation pixels between two vertical first interpolation pixels 56a and between two vertical second interpolation pixels 56b to obtain the outputs of the interpolation pixels.

Note that the digital camera of the fourth embodiment basically has the same configuration as the digital camera 2 of the first embodiment, except that part of the pixel array of the imaging surface 23a is different from the first embodiment. Therefore, the same functions and configurations as in the first embodiment are designated with the same reference numerals, and the explanation is omitted.

The color imaging element 23 of the fourth embodiment basically has the same configuration as the color imaging element 23 of the first embodiment, except that each horizontal row 43 provided with the first and second phase difference pixels 36a and 36b are arranged at a three-pixel pitch interval, a nine-pixel pitch interval, a three-pixel pitch interval, a nine-pixel pitch interval . . . in the vertical direction.

Figure 18:
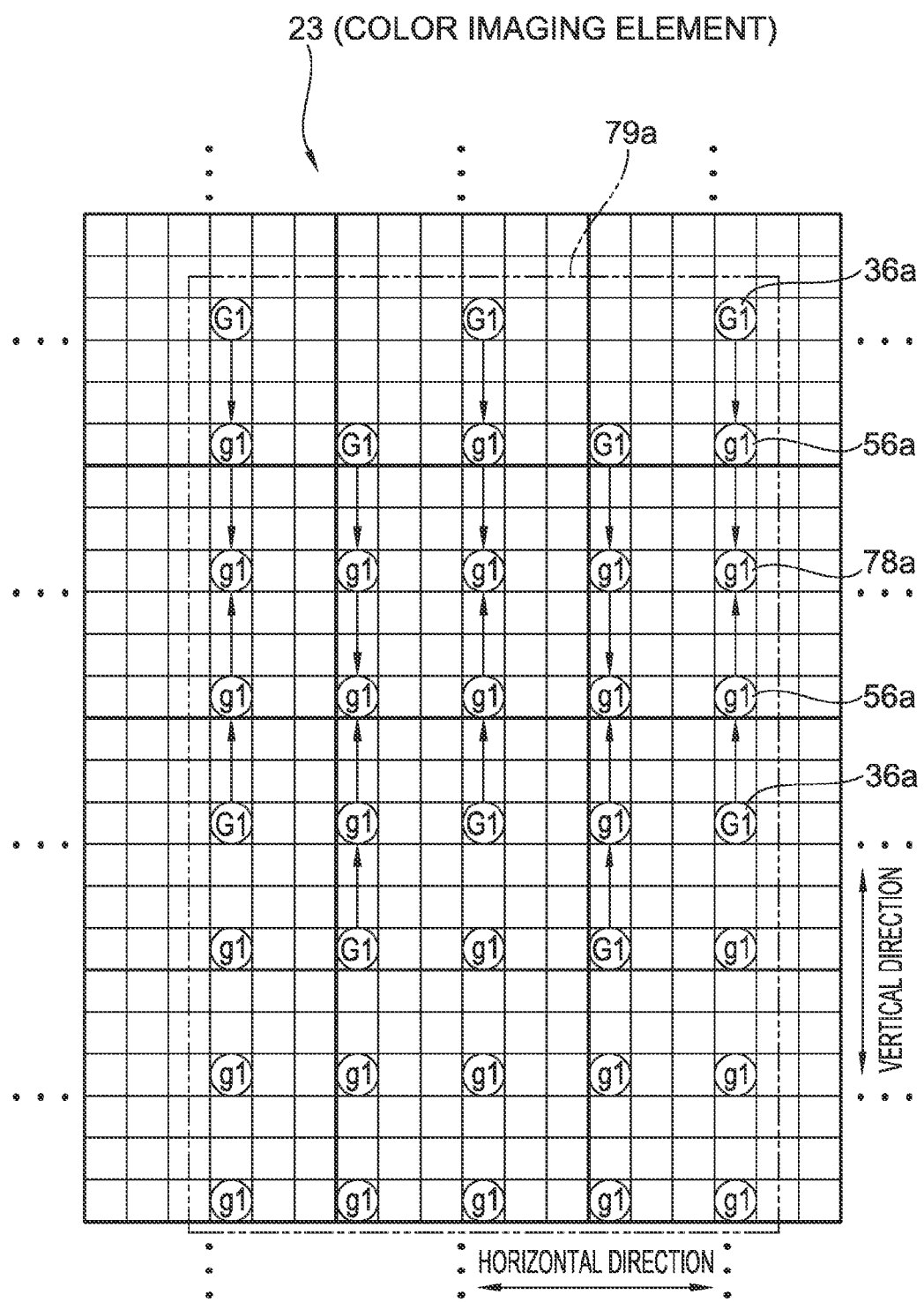
FIG. 18 is an explanatory view for explaining an interpolation process of the first phase difference pixels.

As shown in FIG. 18, the pixel interpolation processing unit 53 of the fourth embodiment virtually interpolates two or more first interpolation pixels 56a between two vertical first phase difference pixels 36a and obtains the outputs of the first interpolation pixels 56a as in the first embodiment (two first interpolation pixels 56a are illustrated as an example in the drawing). Next, the image interpolation processing unit 53 virtually interpolates first' interpolation pixels 78a between two vertical first interpolation pixels 56a in the drawing in each vertical column 42 based on the outputs of the first interpolation pixels 56a in each vertical column 42 and obtains outputs of the first' interpolation pixels 78a. In this case, the first interpolation pixels 56a and the first' interpolation pixels 78a are interpolated so that the first phase difference pixels 36a, the first interpolation pixels 56a, and the first' interpolation pixels 78a are arranged at equal intervals (three-pixel pitch intervals in the present embodiment) in the vertical direction in each vertical column 42.

The outputs of the first' interpolation pixels 78a are determined based on the outputs of the neighborhood first interpolation pixels 56a. For example, as indicated by arrows in the drawing, average values of the outputs of two vertical first interpolation pixels 56a may be used. In this way, outputs of a first pixel group 79a including the first phase difference pixels 36a, the first interpolation pixels 56a, and the first' interpolation pixels 78a arranged in a square lattice shape are obtained.

Figure 19:
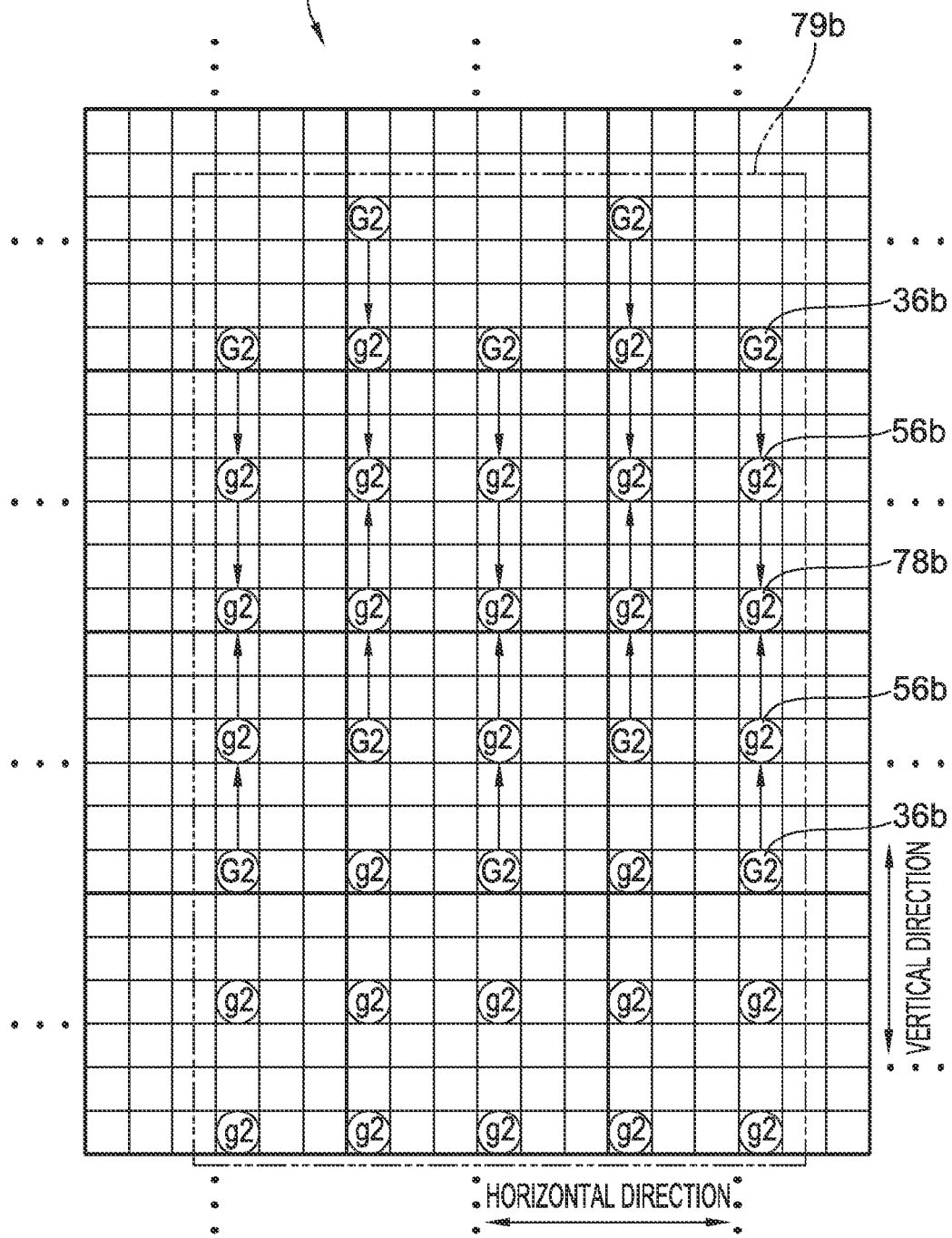
FIG. 19 is an explanatory view for explaining an interpolation process of the second phase difference pixels.

Further, as shown in FIG. 19, the pixel interpolation processing unit 53 virtually interpolates two or more second interpolation pixels 56b between two vertical second phase difference pixels 36b and obtains the outputs of the second interpolation pixels 56b as in the first embodiment (two second interpolation pixels 56b are illustrated as an example in the drawing). Next, the image interpolation processing unit 53 virtually interpolates second' interpolation pixels 78b between two vertical second interpolation pixels 56b in the drawing in each vertical column 42 based on the outputs of the second interpolation pixels 56a in each vertical column 42 and obtains outputs of the second' interpolation pixels 78b. In this case, the second interpolation pixels 56b and the second' interpolation pixels 78b are interpolated so that the second phase difference pixels 36b, the second interpolation pixels 56b, and the second' interpolation pixels 78b are arranged at equal intervals in the vertical direction in each vertical column 42.

Average values of the outputs of two vertical second interpolation pixels 56b may be used as the outputs of the second' interpolation pixels 78b as indicated by arrows in the drawing, for example. In this way, outputs of a second pixel group 79b including the second phase difference pixels 36b, the second interpolation pixels 56b, and the second' interpolation pixels 78b arranged in a square lattice shape are obtained.

Thereafter, the split image data 61 is generated as in the first embodiment. The virtual interpolation of the interpolation pixels 56a, 56b, 78a, and 78b in each vertical column 42 can reduce the numbers of first and second phase difference pixels 36a and 36b.

Furthermore, since the interpolation pixels 56a, 56b, 78a, and 78b are interpolated so that the pixels of the first and second pixel groups 79a and 79b are arranged at equal intervals in the vertical direction in a square lattice shape in each vertical column 42, jaggies of the split image can be reduced. Further, since the split image data 61 can be easily generated, the image quality of the split image 66 is further improved, and the focus adjustment can be easily performed.

[Configuration of Digital Camera of Fifth Embodiment]

Figure 20:
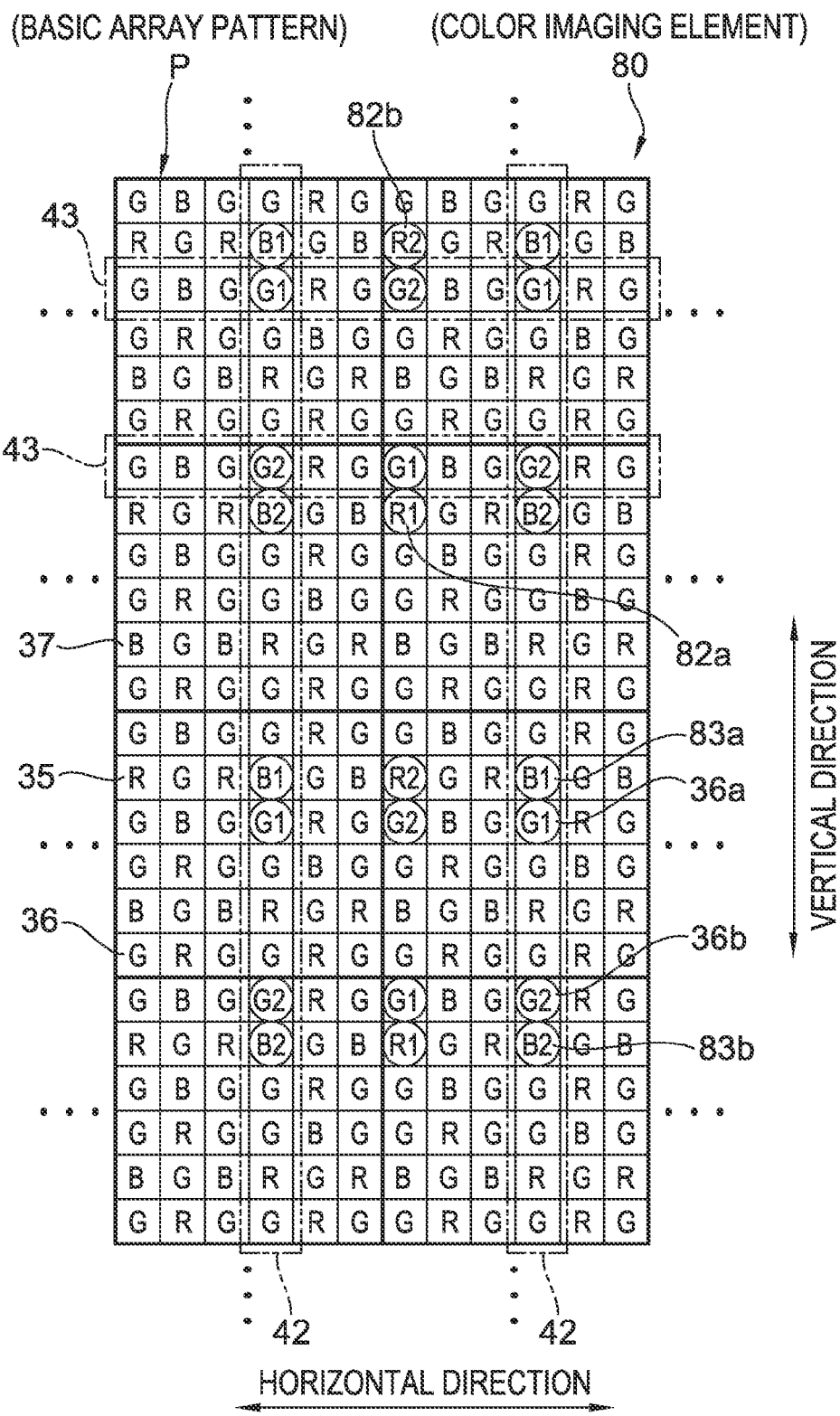
FIG. 20 is a front view of an imaging surface of a color imaging element of a digital camera of a fifth embodiment.

Next, a digital camera of a fifth embodiment of the present invention is explained with reference to FIG. 20. In the digital camera 2 of the first embodiment, only the first and second phase difference pixels 36a and 36b of G color are provided on the imaging surface 23a to generate the black and white split image data 61. On the other hand, full-color split image data is generated in the digital camera of the fifth embodiment.

Note that the digital camera of the fifth embodiment basically has the same configuration as the first embodiment, except that a color imaging element 80 different from the digital camera 2 of the first embodiment is included. Therefore, the same functions and configurations as in the first embodiment are designated with the same reference numerals, and the explanation is omitted.

First and second phase difference pixels 82a and 82b of R color and first and second phase difference pixels 83a and 83b of B color are arranged on the imaging surface of the color imaging element 80, in addition to the RGB pixels 35 to 37 and the first and second phase difference pixels 36a and 36b of G color. The phase difference pixels 82a, 82b, 83a, and 83b are alternately provided at intervals in a plurality of vertical columns 42 and a plurality of horizontal rows 43, just like the first and second phase difference pixels 36a and 36b. Note that the first phase difference pixels 82a and 83a have the same structure as the first phase difference pixels 36a, except that the colors of the color filters 40 are different. Further, the second phase difference pixels 82b and 83b have the same structure as the second phase difference pixels 36b, except that the colors of the color filters 40 are different.

Figure 21:
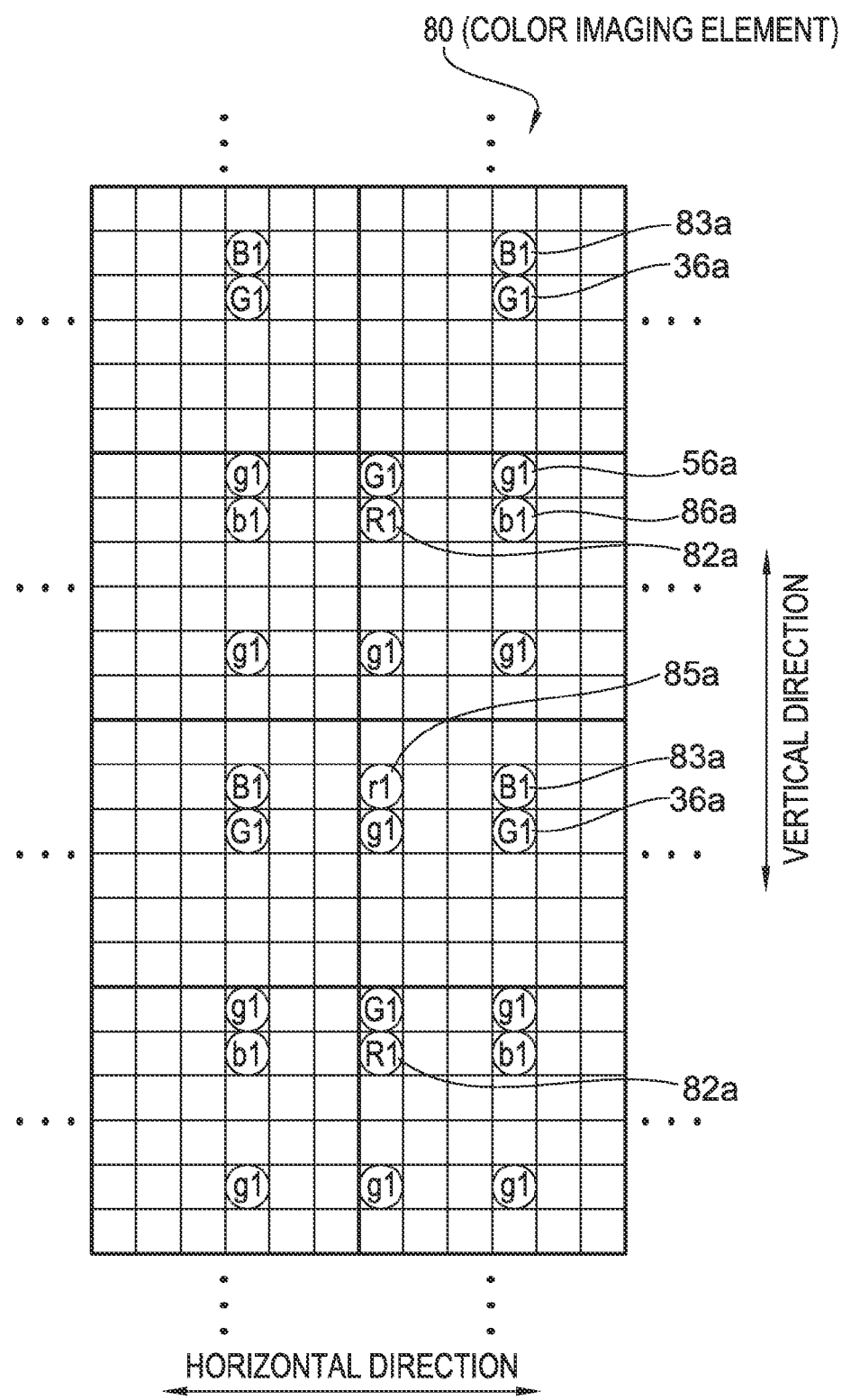
FIG. 21 is an explanatory view for explaining an interpolation process of the first phase difference pixels.

As shown in FIG. 21, the pixel interpolation processing unit 53 of the fifth embodiment virtually interpolates first interpolation pixels 56a, 85a, and 86a between two vertical first phase difference pixels 36a, 82a, and 83a in the drawing in each vertical column 42 to obtain outputs of the first interpolation pixels 56a, 85a, and 86a of each color, as in the first embodiment. In this way, outputs of a first pixel group including the first phase difference pixels 36a, 82a, and 83a and the first interpolation pixels 56a, 85a, and 86a of each color are obtained.

Figure 22:
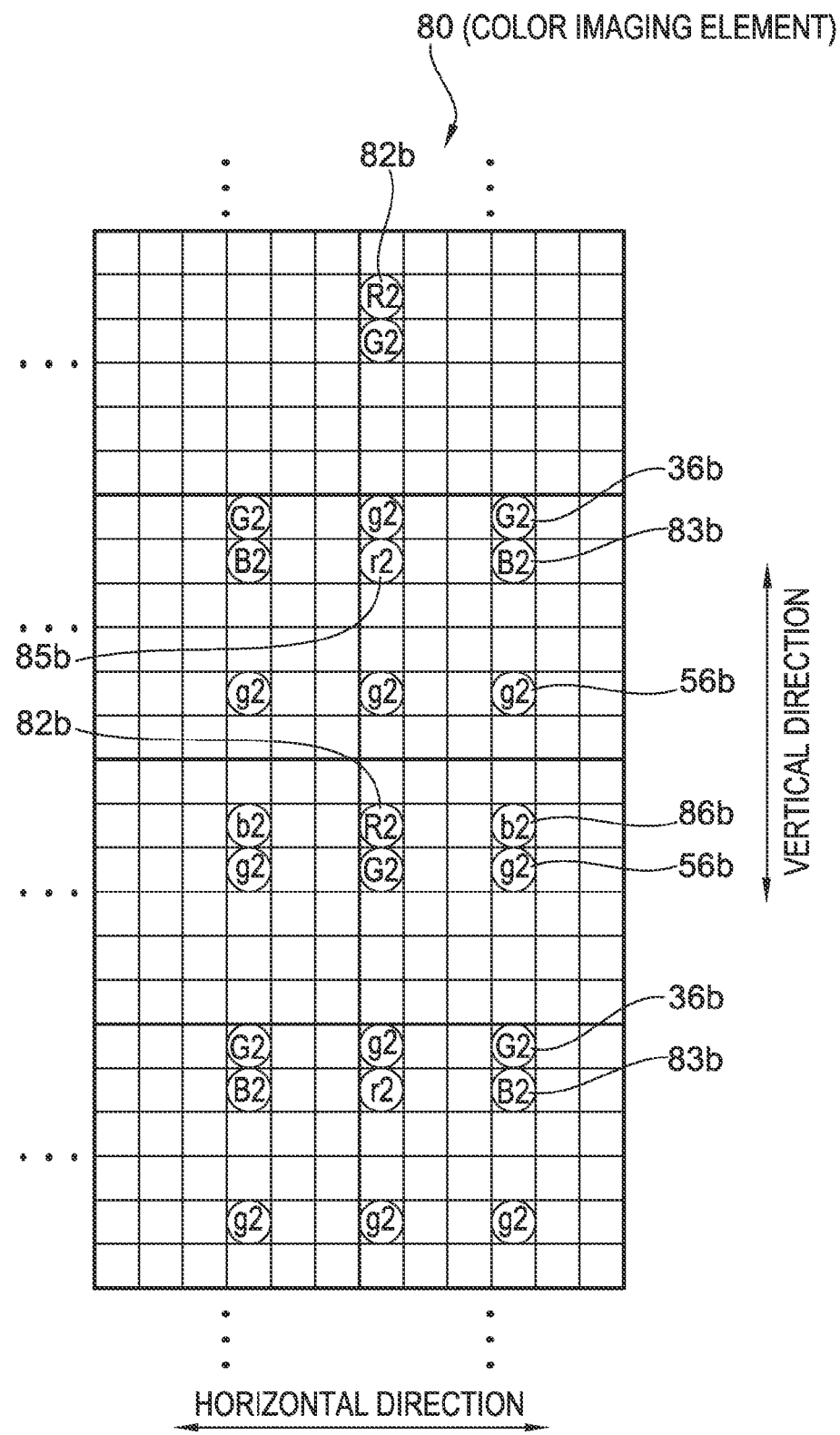
FIG. 22 is an explanatory view for explaining an interpolation process of the second phase difference pixels.

As shown in FIG. 22, the pixel interpolation processing unit 53 virtually interpolates the second interpolation pixels 56b, 85b, and 86b between two vertical second phase difference pixels 36b, 82b, and 83b in the drawing in each vertical column 42 to obtain outputs of the second interpolation pixels 56b, 85b, and 86b of each color, as in the first embodiment. In this way, outputs of a second pixel group including the second phase difference pixels 36b, 82b, and 83b and the second interpolation pixels 56b, 85b, and 86b of each color are obtained.

The split image processing unit 54 of the fifth embodiment generates split image data including full-color first image data and second image data based on output signals from the first pixel group and the second pixel group. In this way, a full-color split image can be displayed in the live-view image 67. Note that the digital camera of the fifth embodiment is basically the same as the digital camera 2 of the first embodiment except that the full-color split image is generated and output, and the effects explained in the first embodiment can be obtained.

[Configuration of Digital Camera of Sixth Embodiment]

Figure 23:
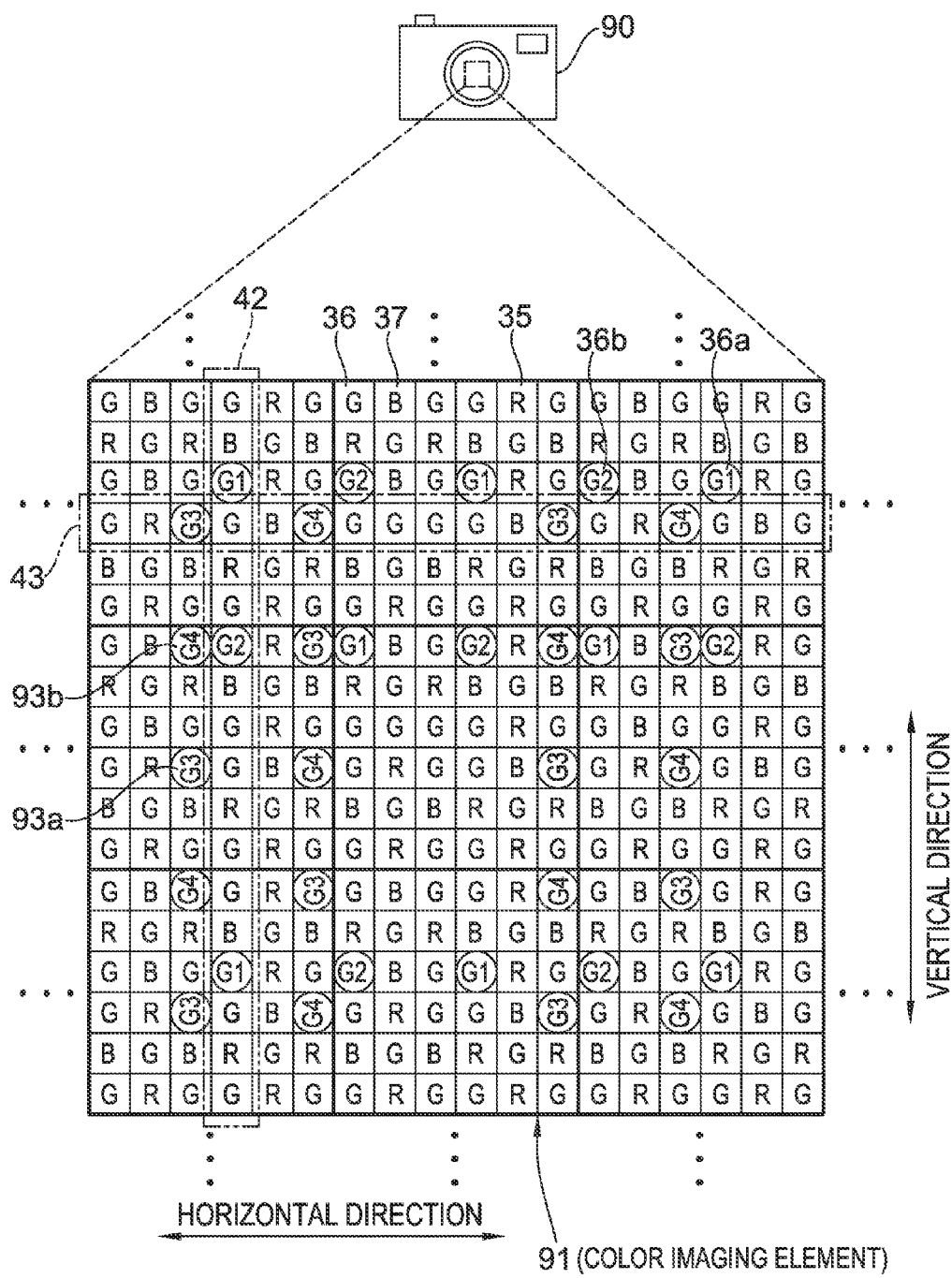
FIG. 23 is a front view of the imaging surface of the color imaging element of a digital camera of a sixth embodiment.

Next, a digital camera 90 of a sixth embodiment of the present invention is explained with reference to FIG. 23. When the digital camera 2 of the first embodiment performs so-called vertical imaging for taking an image in a state that the camera is rotated 90° about the optical axis 01, the split image 66 is also displayed in a state that the image is rotated 90°. On the other hand, the digital camera 90 displays vertically divided split image data even when the vertical imaging is performed.

Note that the digital camera 90 basically has the same configuration as the first embodiment, except that a color imaging element 91 different from the digital camera 2 of the first embodiment is included. Therefore, the same functions and configurations as in the first embodiment are designated with the same reference numerals, and the explanation is omitted.

Third phase difference pixels 93a and fourth phase difference pixels 93b of G color are alternately provided at intervals in a plurality of vertical columns 42 and a plurality of horizontal rows 43 on the imaging surface of the color imaging element 91, in addition to the RGB pixels 35 to 37 and the first and second phase difference pixels 36a and 36b of G color. The third phase difference pixels 93a and the fourth phase difference pixels 93b have the same structure as when the first and second phase difference pixels 36a and 36b are rotated 90° about the optical axis 01.

As shown in (I) portion of FIG. 24 where L1 represents a straight line orthogonal to the optical axis 01 and parallel to the vertical direction, the sensitivities of the first and second phase difference pixels 36a and 36b are high with respect to the object lights 50L and 50R (see FIG. 5) that have passed through the left area 17L and the right area 17R, respectively, symmetric with respect to the first straight line L1 passing through the center of the imaging optical system 17. Meanwhile, as shown in (II) portion of FIG. 24 where L2 represents a straight line orthogonal to the optical axis 01 and parallel to the horizontal direction, the sensitivities of the third phase difference pixels 93a and the fourth phase difference pixels 93b are high with respect to the object light that has passed through an upper area 17U and a lower area 17D symmetric with respect to the second straight line L2 passing through the center of the imaging optical system 17. Therefore, when the digital camera 90 is rotated 90° about the optical axis 01, the third phase difference pixels 93a and the fourth phase difference pixels 93b can be used in place of the first and second phase difference pixels 36a and 36b to generate split image data.

Figure 25:
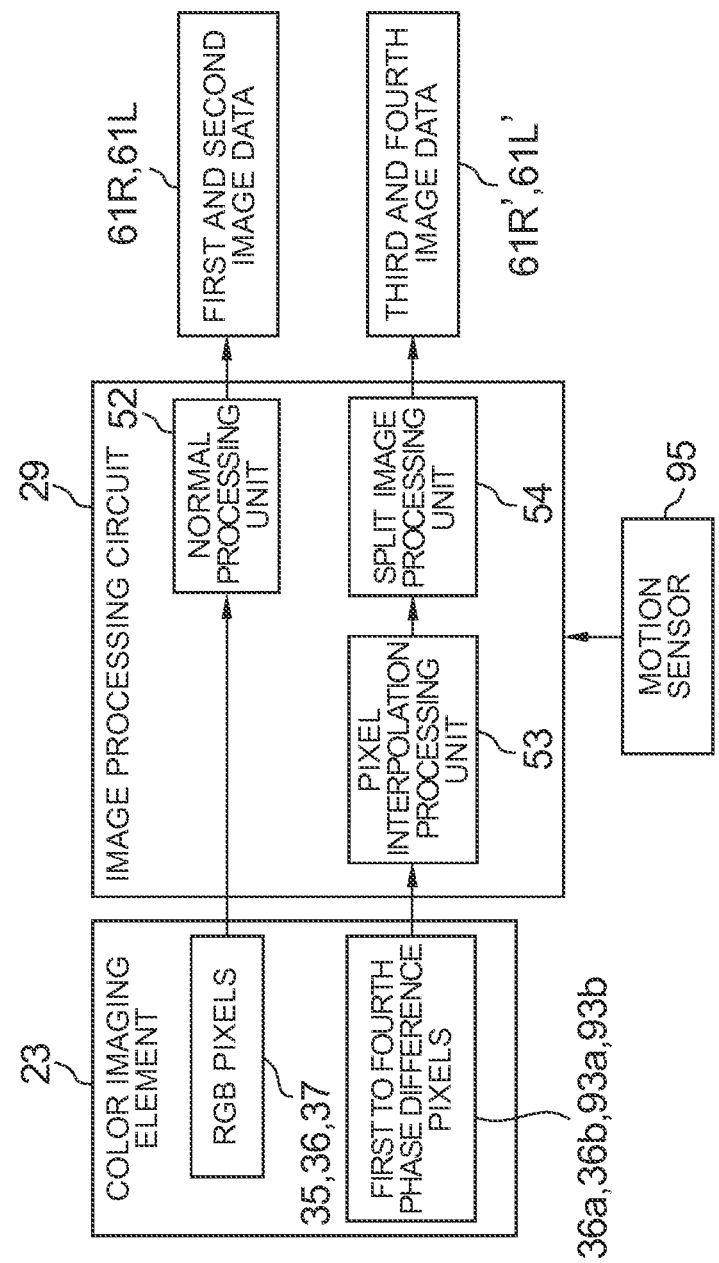
FIG. 25 is a block diagram showing an electrical configuration of the digital camera of the sixth embodiment.

As shown in FIG. 25, a motion sensor (rotation detection device) 95 that detects the rotation of the digital camera 90 (color imaging element 91) about the optical axis 01 is connected to the image processing circuit 29. Note that various sensors other than the motion sensor may be used as long as the rotation of the digital camera 90 can be detected. When the digital camera 90 rotates 90° about the optical axis 01 based on a detection signal from the motion sensor 95, the pixel interpolation processing unit 53 assumes each horizontal row 43 as each vertical column 42 and executes an interpolation process of the third phase difference pixels 93a and the fourth phase difference pixels 93b.

Figure 26:
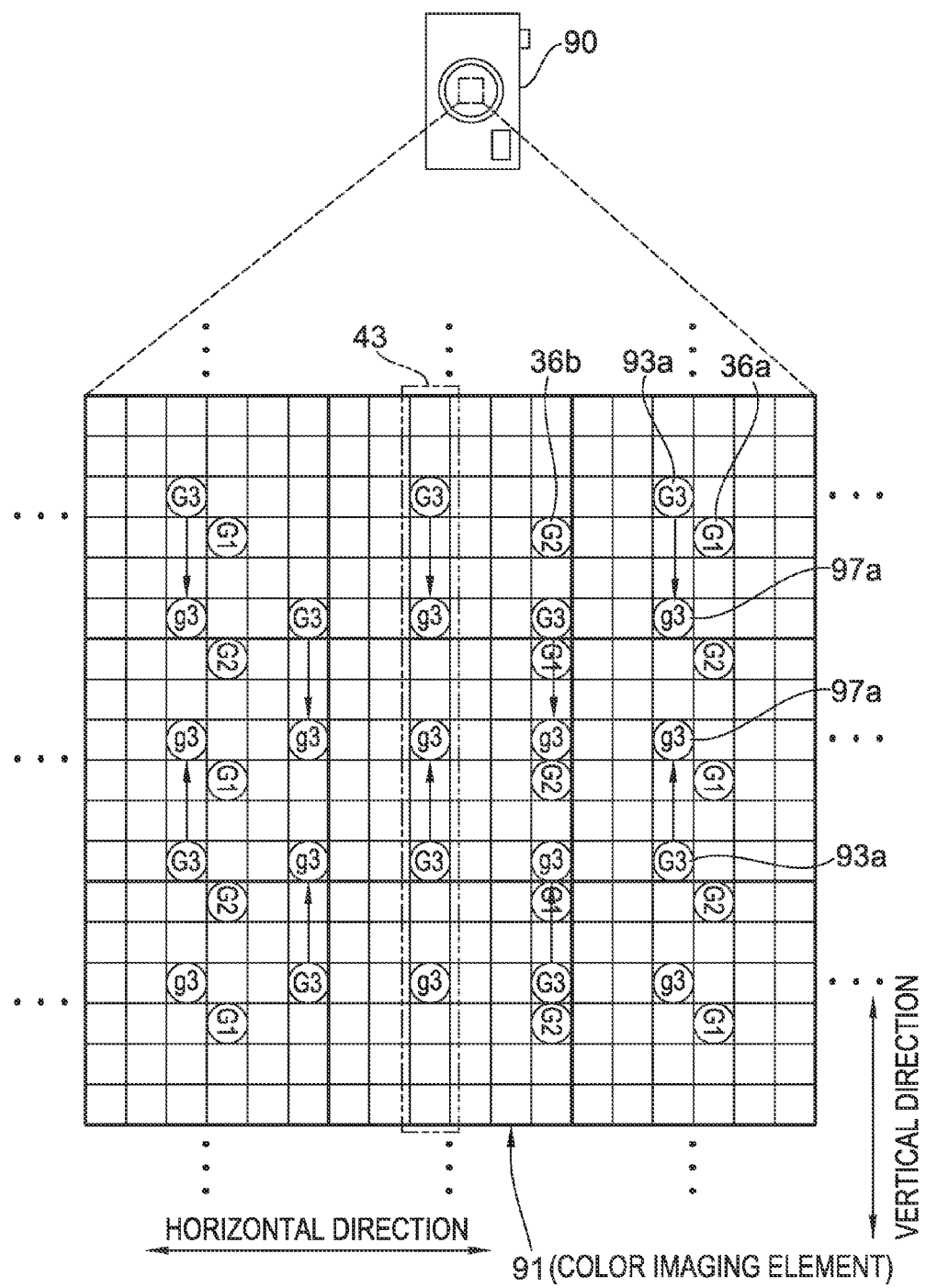
FIG. 26 is an explanatory view for explaining an interpolation process of third phase difference pixels in vertical imaging.
Figure 27:
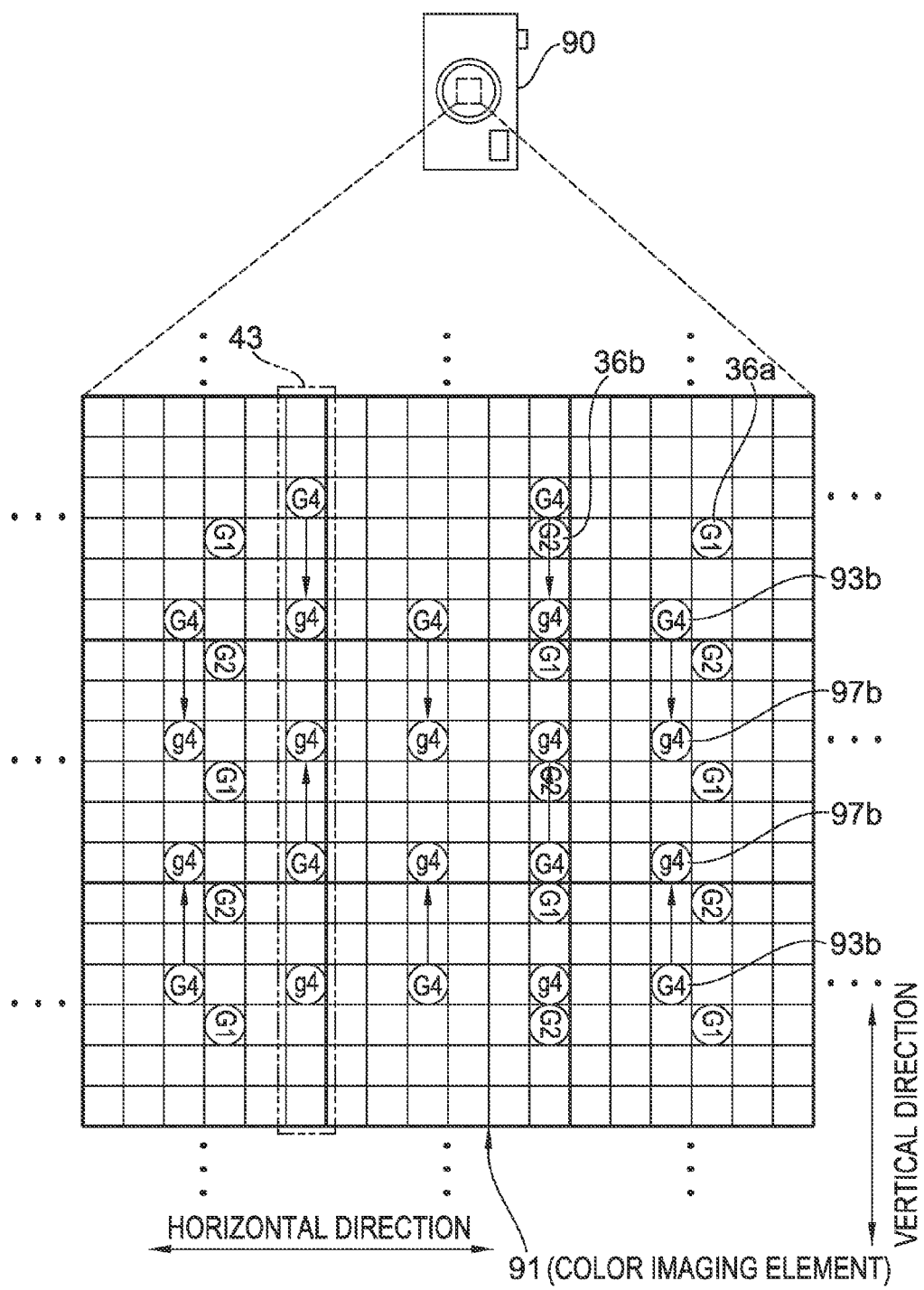
FIG. 27 is an explanatory view for explaining an interpolation process of the third phase difference pixels in vertical imaging.

Specifically, as shown in FIG. 26 and FIG. 27, one or more third interpolation pixels 97a are virtually interpolated between two vertical third phase difference pixels 93a in the drawing to obtain outputs of the third interpolation pixels 97a (two third interpolation pixels 97a are illustrated as an example in the drawing). Further, one or more fourth interpolation pixels 97b are virtually interpolated between two vertical fourth phase difference pixels 93b in the drawing to obtain outputs of fourth interpolation pixels 97b (two fourth interpolation pixels 97b are illustrated as an example in the drawing). The interpolation process of the third and fourth interpolation pixels 97a and 97b is basically the same as the interpolation process of the first and second interpolation pixels 56a and 56b, and specific explanation is omitted here. In this way, outputs of a third pixel group including the third phase difference pixels 93a and the third interpolation pixels 97a are obtained. Further, outputs of a fourth pixel group including the fourth phase difference pixels 93b and the fourth interpolation pixels 97b are obtained.

The split image processing unit 54 generates black and white third image data 61L' (see FIG. 25) based on luminance components of output signals (outputs) from the third pixel group and generates black and white fourth image data 61R' (see FIG. 25) based on luminance components of output signals from the fourth pixel group. In this way, black and white split image data including the third image data 61L' and the fourth image data 61R' can be obtained. As a result, the vertically divided black and white split image 66 as shown in FIG. 11 and FIG. 12 is displayed in the live-view image 67 even when the vertical imaging is performed.

[Etc.]

Although the color filter array of the color imaging element of each embodiment has the basic array pattern P corresponding to 6×6 pixels repeatedly arranged in the horizontal and vertical directions, the color filter array may have a basic array pattern of an array pattern corresponding to N×N pixels (N is 3 or more).

Although the color filter array of the color filters of three primary colors of RGB is explained in each embodiment, the color filter array may include, for example, color filters of four colors including three primary colors of RGB+another color (for example, emerald (E)), and the type of the color filters is not particularly limited. Further, the present invention can also be applied to a color filter array of color filters of C (cyan), M (magenta), and Y (yellow) that are complementary colors of the primary colors RGB.

Although the first and second phase difference pixels 36a and 36b are alternately provided at intervals in each vertical column 42 and each horizontal row 43 in the first embodiment, the arrangement of the first and second phase difference pixels 36a and 36b is not particularly limited as long as the first and second phase difference pixels 36a and 36b are provided in each vertical column 42. Further, the interval of each vertical column 42 and the interval of each horizontal row 43 may also be appropriately changed. In this case, it is preferable to arrange the first and second phase difference pixels 36a and 36b so that the pixels of the first and second pixel groups 57a and 57b can be arranged at equal intervals in the vertical direction by the pixel interpolation process. Note that the same applies to the second to sixth embodiments (including the third and fourth phase difference pixels).

Although the first and second phase difference pixels 36a and 36b are provided in the center area of the imaging surface 23a in the first embodiment, the first and second phase difference pixels 36a and 36b may be provided in an arbitrary area of the imaging surface. Further, the first and second phase difference pixels 36a and 36b may be provided on the entire surface of the imaging surface. Note that the same applies to the second to sixth embodiments (including the third and fourth phase difference pixels).

Although two types of first and second phase difference pixels 36a and 36b are provided on the imaging surface 23a in the first embodiment, a plurality of types of first and second phase difference pixels 36a and 36b that can generate a first image and a second image (split image) with different parallax amount may be provided on the imaging surface. The image processing circuit 29 selects the types of the first and second phase difference pixels 36a and 36b according to switch operation of the split image in the operation unit 9 and generates split image data. In this way, the type of the split image displayed on the display unit 8 can be arbitrarily switched.

Although the digital camera is explained as an example of the imaging device of the present invention in each embodiment, the present invention can also be applied to, for example, a portable phone, a smartphone, a PDA (Personal Digital Assistants), and a portable game machine with a camera function. Hereinafter, an example of a smartphone is explained in detail with reference to the drawings.

Although the first and second phase difference pixels 36a and 36b of G color are provided in each vertical column 42 in the first embodiment, first and second phase difference pixels of R color, B color, or the like other than the G color may be provided instead. Note that the same applies to each embodiment other than the fifth embodiment.

<Configuration of Smartphone>

Figure 28:
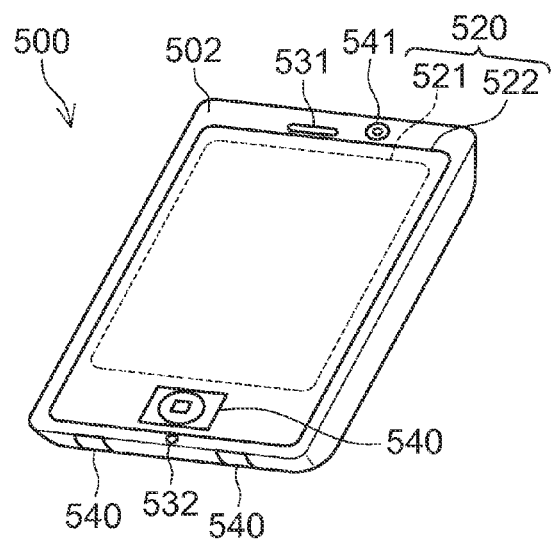
FIG. 28 is a perspective view of a smartphone.

FIG. 28 shows an appearance of a smartphone 500. The smartphone 500 shown in FIG. 28 includes: a planar housing 502; and a display input unit 520 in which a display panel 521 as a display unit and an operation panel 522 as an input unit are integrated on one of the surfaces of the housing 502. Further, the housing 502 includes a speaker 531, a microphone 532, an operation unit 540, and a camera unit 541. Note that the configuration of the housing 502 is not limited to this, and for example, a configuration in which the display unit and the input unit are independent can be adopted, or a configuration including a folding structure or a slide mechanism can be adopted.

Figure 29:
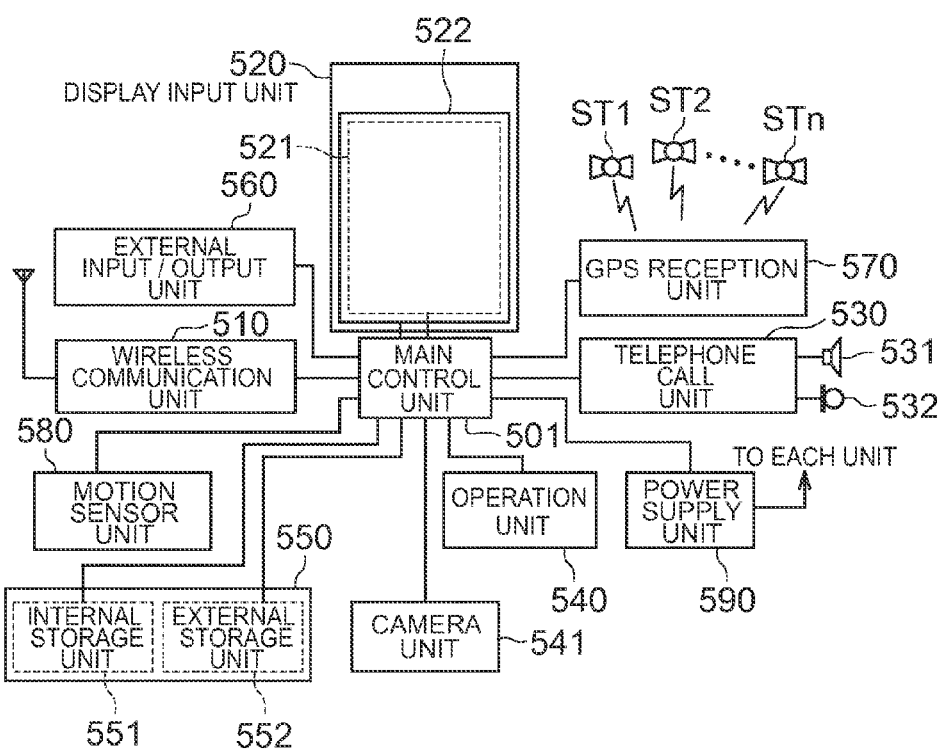
FIG. 29 is a block diagram showing an electrical configuration of the smartphone.

FIG. 29 is a block diagram showing a configuration of the smartphone 500 shown in FIG. 28. As shown in FIG. 29, main constituent elements of the smartphone include a wireless communication unit 510, the display input unit 520, a telephone call unit 530, the operation unit 540, the camera unit 541, a storage unit 550, an external input/output unit 560, a GPS (Global Positioning System) reception unit 570, a motion sensor unit 580, a power supply unit 590, and a main control unit 501. Further, main functions of the smartphone 500 include a wireless communication function for performing mobile wireless communication through a base station apparatus BS and a mobile communication network NW.

The wireless communication unit 510 performs wireless communication with the base station apparatus BS housed in the mobile communication network NW according to an instruction of the main control unit 501. The wireless communication is used to transmit and receive voice data, various file data such as image data, electronic mail data, and the like and to receive Web data, streaming data, and the like.

The display input unit 520 is a so-called touch panel for displaying images (still images and moving images), character information, and the like to visually transmit information to the user and for detecting user operation for the displayed information based on the control of the main control unit 501 and includes the display panel 521 and the operation panel 522. It is preferable that the display panel 521 be a 3D display panel to view generated 3D images.

The display panel 521 is a panel in which an LCD (Liquid Crystal Display), an OELD (Organic Electro-Luminescence Display), or the like is used as a display device. The operation panel 522 is a device that is mounted to allow visually recognizing images displayed on the display surface of the display panel 521 and that detects one or a plurality of coordinates operated by a finger of the user or a stylus. When the device is operated by a finger of the user or a stylus, a detection signal generated by the operation is output to the main control unit 501. Next, the main control unit 501 detects an operation position (coordinates) on the display panel 521 based on the received detection signal.

As shown in FIG. 28, the display panel 521 and the operation panel 522 of the smartphone 500 are integrated to form the display input unit 520, and the operation panel 522 is arranged to completely cover the display panel 521. When this arrangement is adopted, the operation panel 522 may have a function of detecting user operation for an area outside of the display panel 521. In other words, the operation panel 522 may include a detection area (hereinafter, called display area) for a superimposed part overlapping with the display panel 521 and a detection area (hereinafter, called non-display area) for a peripheral part other than the detection area not overlapping with the display panel 521.

Note that although the size of the display area and the size of the display panel 521 may completely match, the sizes may not match. Further, the operation panel 522 may include two sensitive areas, a peripheral part and an inside part other than the peripheral part. Further, the width of the peripheral part is appropriately designed according to the size of the housing 502 or the like. Furthermore, examples of the position detection system adopted in the operation panel 522 include a matrix switch system, a resistive film system, a surface acoustic wave system, an infrared system, an electromagnetic induction system, and an electrostatic capacitance system, and any system can be adopted.

The telephone call unit 530 includes the speaker 531 and the microphone 532 and is configured to convert voice of the user input through the microphone 532 into voice data that can be processed by the main control unit 501 to output the voice data to the main control unit 501 and to decode voice data received by the wireless communication unit 510 or the external input/output unit 560 to output the voice data from the speaker 531. Further, as shown in FIG. 28, for example, the speaker 531 can be mounted on the same surface as the surface provided with the display input unit 520, and the microphone 532 can be mounted on the side surface of the housing 502.

The operation unit 540 is a hardware key using a key switch or the like and is configured to receive an instruction from the user. For example, as shown in FIG. 29, the operation unit 540 is mounted on the lower part and the lower surface of the display unit of the housing 502 of the smartphone 500. The operation unit 540 is a push-button type switch that is turned on when pressed by a finger or the like and that enters an off state due to restoring force of a spring or the like when the finger is detached.

The storage unit 550 stores a control program and control data of the main control unit 501, application software including an image processing program for generating a left-eye image and a right-eye image according to the present invention, first and second digital filter groups used for generating stereoscopic images, a parallax map, address data associating the name, the phone number, and the like of the communication partner, data of transmitted and received electronic mail, Web data downloaded by Web browsing, and downloaded content data and also temporarily stores streaming data and the like. Further, the storage unit 550 includes an internal storage unit 551 embedded in the smartphone and an external storage unit 552 including a removal external memory slot. Note that the internal storage unit 551 and the external storage unit 552 included in the storage unit 550 are realized by using storage media, such as a flash memory type (flash memory type), a hard disk type (hard disk type), a multimedia card micro type (multimedia card micro type), a card-type memory (for example, Micro SD (registered trademark) memory or the like), a RAM (Random Access Memory), and a ROM (Read Only Memory).

The external input/output unit 560 serves as an interface with all external devices connected to the smartphone 500 and is for direct or indirect connection with another external device through communication or the like (for example, universal serial bus (USB), IEEE 1394, or the like) or through a network (for example, Internet, wireless LAN, Bluetooth (Bluetooth) (registered trademark), RFID (Radio Frequency Identification), infrared communication (Infrared Data Association: IrDA), (registered trademark), UWB (Ultra Wideband) (registered trademark), ZigBee (ZigBee) (registered trademark), or the like).

Examples of the external devices connected to the smartphone 500 include a wired/wireless head set, a wired/wireless external charger, a wired/wireless data port, a memory card (MEMORY CARD) or a SIM (SUBSCRIBER IDENTIFY MODULE CARD)/UIM (USER IDENTITY MODULE CARD) card connected through a card socket, an external audio video device connected through an audio video I/O (INPUT/OUTPUT) terminal, a wirelessly connected external audio video device, a smartphone for wired/wireless connection, a personal computer for wired/wireless connection, a PDA for wired/wireless connection, an earphone, and the like. The external input/output unit can transmit data transmitted from the external devices to each constituent element inside of the smartphone 500 and can transmit data inside of the smartphone 500 to the external devices.

The GPS reception unit 570 receives GPS signals transmitted from GPS satellites ST1 to STn according to an instruction of the main control unit 501 and executes positioning arithmetic processing based on the plurality of received GPS signals to detect the position including latitude, longitude, and altitude of the smartphone 500. When position information can be acquired from the wireless communication unit 510 or the external input/output unit 560 (for, example, wireless LAN), the GPS reception unit 570 can also use the position information to detect the position.

The motion sensor unit 580 includes, for example, a triaxial acceleration sensor or the like and detects physical motion of the smartphone 500 according to an instruction of the main control unit 501. The movement direction and the acceleration of the smartphone 500 are detected by the detection of the physical motion of the smartphone 500. The detection result is output to the main control unit 501.

The power supply unit 590 supplies power stored in a battery (not shown) to each unit of the smartphone 500 according to an instruction of the main control unit 501.

The main control unit 501 includes a microprocessor and is configured to operate according to a control program or control data stored in the storage unit 550 to comprehensively control each unit of the smartphone 500. Further, the main control unit 501 has a mobile communication control function and an application processing function for controlling each unit of the communication system in order to perform voice communication and data communication through the wireless communication unit 510.

The application processing function is realized by the operation of the main control unit 501 according to application software stored in the storage unit 550. Examples of the application processing function include an infrared communication function of controlling the external input/output unit 560 to perform data communication with an opposing device, an electronic mail function of transmitting and receiving electronic mail, a Web browsing function of browsing a Web page, a function of generating a 3D image from a 2D image according to the present invention, and the like.

Further, the main control unit 501 has an image processing function such as for displaying images on the display input unit 520 based on image data (data of still images and moving images) such as received data and downloaded streaming data. The image processing function denotes a function by the main control unit 501 decoding the image data and applying image processing to the decoding result to display images on the display input unit 520.

Furthermore, the main control unit 501 executes display control for the display panel 521 and operation detection control for detecting user operation through the operation unit 540 and the operation panel 522.

Through the execution of the display control, the main control unit 501 displays an icon for activating the application software and a software key such as a scroll bar or displays a window for creating electronic mail. Note that the scroll bar denotes a software key for receiving an instruction for moving the display part of an image, for a large image or the like that does not fall within the display area of the display panel 521.

Further, through the execution of the operation detection control, the main control unit 501 detects the user operation through the operation unit 540, receives operation for the icon or input of a character string in an input field of the window through the operation panel 522, or receives a scroll request of a display image through the scroll bar.

Furthermore, through the execution of the operation detection control, the main control unit 501 further has a touch panel control function of determining whether the position of operation for the operation panel 522 is a superimposed part (display area) overlapping with the display panel 521 or a peripheral part (non-display area) other than the superimposed part not overlapping with the display panel 521 and controlling the sensitive area of the operation panel 522 and the display position of the software key.

Further, the main control unit 501 can also detect gesture operation for the operation panel 522 to execute a function set in advance according to the detected gesture operation. The gesture operation does not denote conventional simple touch operation, but denotes operation for depicting a trajectory by a finger or the like, designating a plurality of positions at the same time, or combining these to depict a trajectory for at least one of the plurality of positions.

The camera unit (imaging device) 541 is a digital camera that uses an imaging element, such as a CMOS (Complementary Metal Oxide Semiconductor) and a CCD (Charge-Coupled Device), to perform electronic imaging and basically has the same configuration as the digital camera of each embodiment.

Further, through the control of the main control unit 501, the camera unit 541 can convert image data obtained by imaging into compressed image data, such as, for example, JPEG (Joint Photographic coding Experts Group), to record the data in the storage unit 550 or to output the data through the external input/output unit 560 or the wireless communication unit 510. Although the camera unit 541 is mounted on the same surface as the display input unit 520 in the smartphone 500 shown in FIG. 28, the mounting position of the camera unit 541 is not limited to this. The camera unit 541 may be mounted on the back surface of the display input unit 520, or a plurality of camera units 541 may be mounted. Note that when a plurality of camera units 541 are mounted, the camera unit 541 used for imaging can be switched for individual imaging, or a plurality of camera units 541 can be used at the same time for imaging.

Further, the camera unit 541 can be used for various functions of the smartphone 500. For example, an image acquired by the camera unit 541 can be displayed on the display panel 521, or an image of the camera unit 541 can be used as one of the operation inputs of the operation panel 522. Further, when the GPS reception unit 570 detects a position, an image from the camera unit 541 can be referenced to detect the position. Furthermore, an image from the camera unit 541 can be referenced to determine the optical axis direction of the camera unit 541 of the smartphone 500 or to determine the current use environment, without using the triaxial acceleration sensor or using the triaxial acceleration sensor. Obviously, an image from the camera unit 541 can also be used in the application software.

In addition, position information acquired by the GPS reception unit 570, voice information acquired by the microphone 532 (may be text information obtained by voice text conversion by the main control unit or the like), posture information acquired by the motion sensor unit 580, or the like can be added to image data of still images or moving images to record the data in the storage unit 550, or the data can be output through the external input/output unit 560 or the wireless communication unit 510.

<Other Embodiments of Split Image>

Although the split image 66 is divided into two by the division line 63 parallel to the horizontal direction in the examples explained in each embodiment, the split image of the present invention is not limited to this. The split image of the present invention includes a split image that is displayed as a double image when the image is out of focus and that is clearly displayed in a focused state, when two phase difference images (first image, second image) are superimposed, synthesized, and displayed. For example, a split image divided into two by a division line parallel to the vertical direction may be used as the split image 66.

Figure 30:
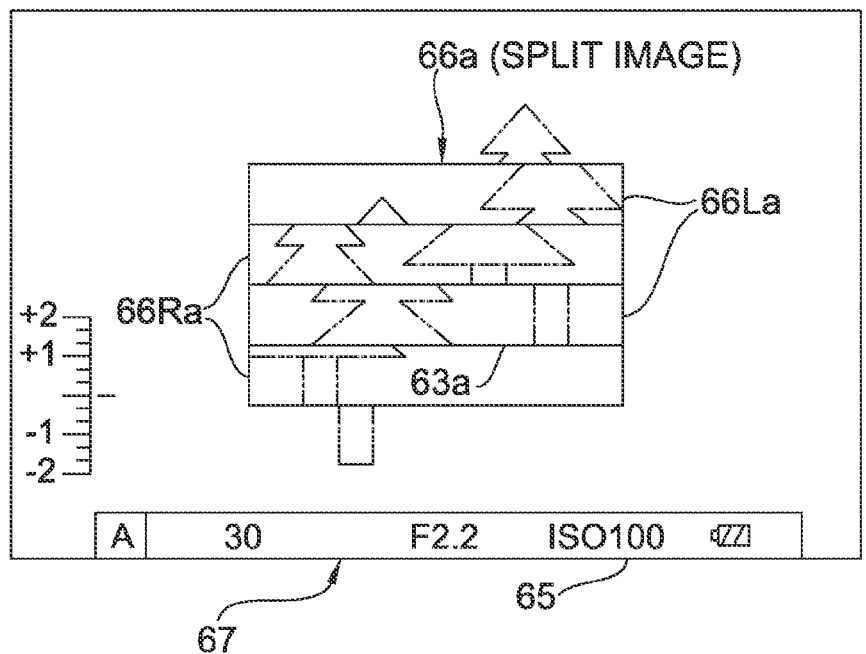
FIG. 30 is an explanatory view of a split image of another embodiment formed by dividing and alternately arranging first images and second images in odd lines and even lines.

Further, for example, a split image 66*a* shown in FIG. 30 is divided into odd lines and even lines by a plurality of division lines 63*a* parallel to the horizontal direction. In the split image 66*a*, line-shaped (strip-shaped) first images 66La generated based on the output signals from the first pixel group 57*a* are displayed in the odd lines (can be even lines), and line-shaped (strip-shaped) second images 66Ra generated based on the output signals from the second pixel group 57*b* are displayed in the even lines.

Figure 31:
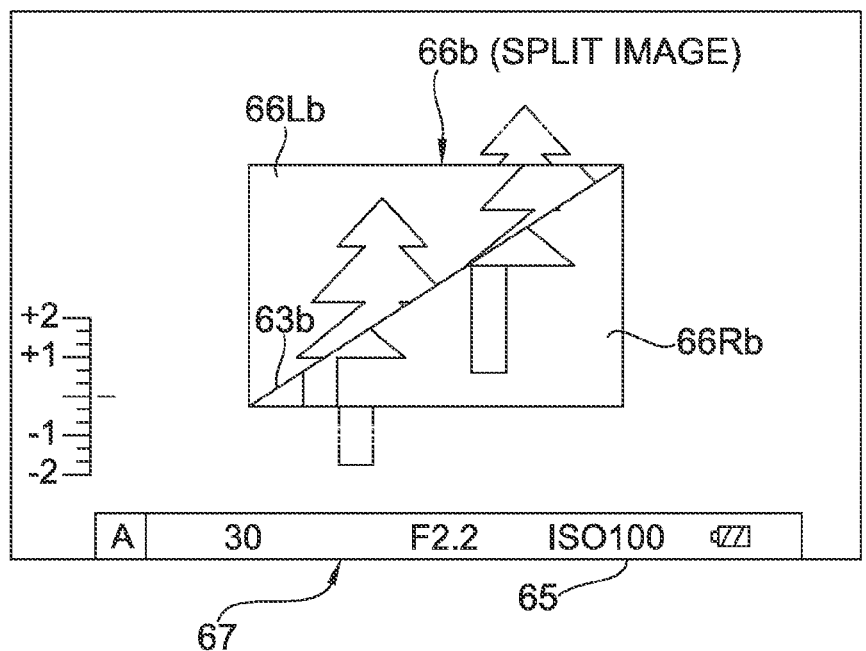
FIG. 31 is a schematic view of a split image of another embodiment divided by an oblique division line inclined relative to a horizontal direction.

Further, a split image 66*b* shown in FIG. 31 is divided into two by a division line 63*b* with an inclination angle in the horizontal direction (for example, diagonal line of the split image 66*b*). In the split image 66*b*, a first image 66Lb generated based on the output signals from the first pixel group 57*a* is displayed in one area, and a second image 66Rb generated based on the output signals from the second pixel group 57*b* is displayed in the other area.

Figure 32A:
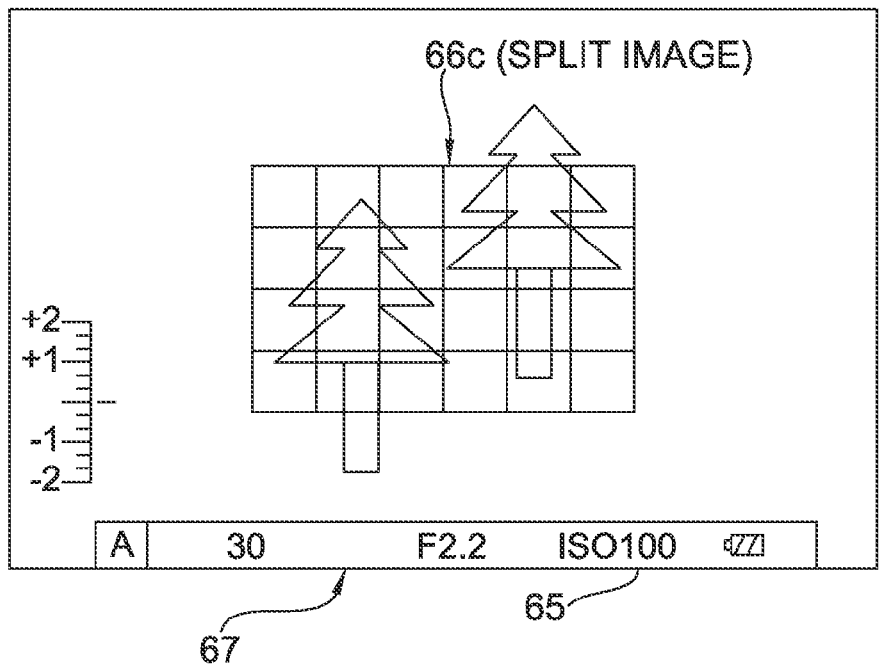
FIG. 32A is a schematic view of a split image of another embodiment formed in a check pattern.
Figure 32B:
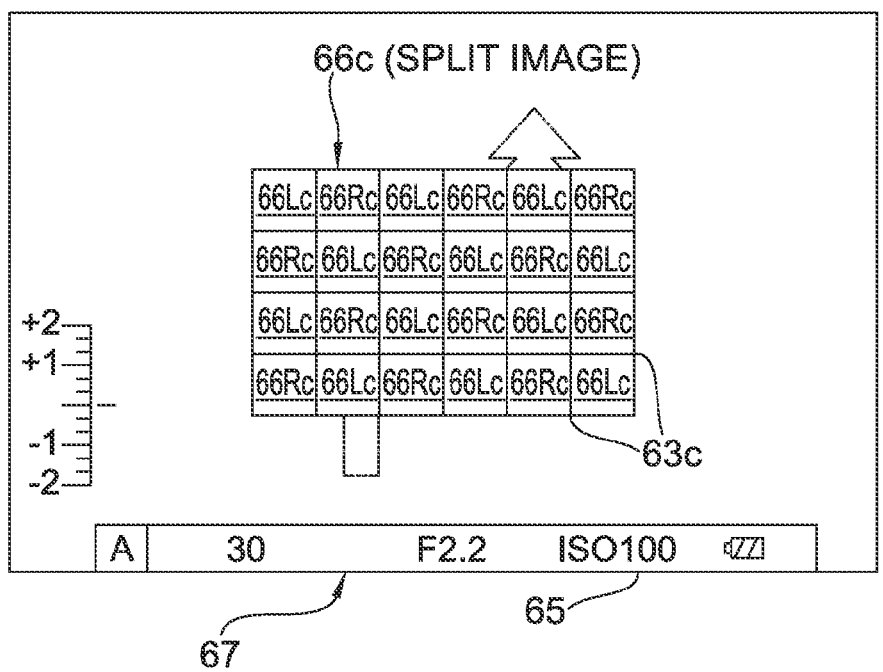
FIG. 32B is a schematic view of the split image of another embodiment formed in a check pattern.

Further, a split image 66*c* shown in FIGS. 32A and 32B is divided by lattice-like division lines 63*c* parallel to the horizontal direction and the vertical direction (see FIG. 32A). In the split image 66*c*, a first image 66Lc generated based on the output signals from the first pixel group 57*a* is arranged and displayed in a check pattern (checker pattern), and a second image 66Rc generated based on the output signals from the second pixel group 57*b* is arranged and displayed in a check pattern (see FIG. 32B).

In this way, in the split images 66*a* to 66*c*, the deviation amounts of the first images 66La, 66Lb, and 66Lc and the second images 66Ra, 66Rb, and 66Rc become zero when the focus lens 16 is set to the focusing position.

What is claimed is:

1. An imaging device comprising:
an imaging optical system including a focus lens;
a lens movement mechanism that receives a focus operation to move the focus lens in an optical axis direction of the imaging optical system;
an imaging element including an imaging surface provided with a matrix pixel array including a plurality of first pixel lines formed by a plurality of pixels including photoelectric conversion elements arranged in a first direction and a plurality of second pixel lines formed by the plurality of pixels arranged in a second direction perpendicular to the first direction, the plurality of pixels including first phase difference pixels and second phase difference pixels for selectively receiving object lights passed through different areas of the imaging optical system by pupil division and including normal pixels for receiving the object lights, the first direction parallel to a phase difference direction corresponding to a deviation direction of images of the object lights formed on the imaging surface by the imaging optical system, the second pixel lines provided with the plurality of first and second phase difference pixels;
a first interpolation device obtaining outputs of first interpolation pixels positioned between the first phase difference pixels in the second pixel lines by an interpolation process based on outputs of the first phase difference pixels;
a second interpolation device obtaining outputs of second interpolation pixels positioned between the second phase difference pixels in the second pixel lines by an interpolation process based on outputs of the second phase difference pixels;
a photographic image generation device generating a photographic image from outputs of the normal pixels;
a split image generation device using a first image formed by the outputs of the first phase difference pixels and the first interpolation pixels and a second image formed by the outputs of the second phase difference pixels and the second interpolation pixels to generate a split image; and
a display device displaying the photographic image generated by the photographic image generation device, the display device displaying the split image generated by the split image generation device in a display area of the photographic image.

2. The imaging device according to claim 1, wherein the first interpolation device obtains the outputs of the first interpolation pixels by setting the first interpolation pixels between the first phase difference pixels so that the first phase difference pixels and the first interpolation pixels are arranged at equal intervals in the second direction, and
the second interpolation device obtains the outputs of the second interpolation pixels by setting the second interpolation pixels between the second phase difference pixels so that the second phase difference pixels and the second interpolation pixels are arranged at equal intervals in the second direction.

3. The imaging device according claim 1, wherein the first interpolation device obtains the outputs of the first interpolation pixels by interpolation in a linear interpolation method based on the outputs and position coordinates of two of the first phase difference pixels in the second pixel lines and position coordinates of the first interpolation pixels, and
the second interpolation device obtains the outputs of the second interpolation pixels by interpolation in the linear interpolation method based on the outputs and position coordinates of two of the second phase difference pixels in the second pixel lines and position coordinates of the second interpolation pixels.

4. The imaging device according to claim 1, wherein the imaging element includes color filters of a plurality of colors arranged in a predetermined color filter array on the plurality of pixels, the color filters of the plurality of colors including first filters corresponding to a first color that most contributes to obtaining luminance signals and second filters corresponding to second color of two or more colors other than the first color,
the first filters are provided on the first and second phase difference pixels, and
the split image generation device uses the first image in black and white generated based on luminance components of the outputs of the first phase difference pixels and the first interpolation pixels and uses the second image in black and white generated based on luminance components of the outputs of the second phase difference pixels and the second interpolation pixels to generate the split image.

5. The imaging device according to claim 4, wherein the first and second filters are arranged on the normal pixels, and
the photographic image generation device generates the photographic image in full color based on the outputs of the normal pixels.

6. The imaging device according to claim 1, further comprising:
a comparison device comparing the outputs of the normal pixels and the outputs of the first and second phase difference pixels; and
a gain adjustment device applying gains to the outputs of the first and second phase difference pixels based on comparison results of the comparison device to equalize the outputs of the first and second phase difference pixels and the outputs of the normal pixels.

7. The imaging device according to claim 1, wherein the first and second phase difference pixels are alternately provided at intervals in the plurality of second pixel lines.

8. The imaging device according to claim 1, wherein the first and second phase difference pixels are alternately provided at intervals in the plurality of first pixel lines.

9. The imaging device according to claim 1, wherein the split image is an image formed by arranging the first image and the second image in the second direction.

10. The imaging device according to claim 1, wherein the different areas of the imaging optical system are a first area and a second area symmetric with respect to a first straight line parallel to the second direction,
the first phase difference pixels selectively receive object light passed through one of the first area and the second area, and the second phase difference pixels selectively receive object light transmitted through the other of the first area and the second area.

11. The imaging device according to claim 10, further comprising:
a plurality of third phase difference pixels provided in the plurality of first pixel lines, the third phase difference pixels selectively receiving object light transmitted through one of a third area and a fourth area symmetric with respect to a second straight line parallel to the first direction of the imaging optical system;
a plurality of fourth phase difference pixels provided in the plurality of first pixel lines, the fourth phase difference pixels selectively receiving object light transmitted through the other of the third area and the fourth area; and
a rotation detection device detecting rotation of the imaging element around the optical axis of the imaging optical system, wherein
when the first pixel lines are parallel to the second direction based on a detection result of the rotation detection device, the first interpolation device obtains outputs of third interpolation pixels positioned between the third phase difference pixels in the first pixel lines by an interpolation process based on outputs of the third phase difference pixels,
when the first pixel lines are parallel to the second direction based on the detection result of the rotation detection device, the second interpolation device obtains outputs of fourth interpolation pixels positioned between the fourth phase difference pixels in the first pixel lines by an interpolation process based on outputs of the fourth phase difference pixels, and when the first pixel lines are parallel to the second direction based on the detection result of the rotation detection device, the split image generation device uses a third image formed by the outputs of the third phase difference pixels and the third interpolation pixels and uses a fourth image formed by the outputs of the fourth phase difference pixels and the fourth interpolation pixels to generate the split image.

12. The imaging device according to claim 4, wherein the first color is green (G), and the second color is red (R) and blue (B).

* * * * *